US012013462B2

(12) United States Patent
Pan et al.

(10) Patent No.: US 12,013,462 B2
(45) Date of Patent: Jun. 18, 2024

(54) LASER EMITTING MODULE AND LIDAR APPARATUS

(71) Applicant: SUTENG INNOVATION TECHNOLOGY CO., LTD., Shenzhen (CN)

(72) Inventors: Shengqiang Pan, Shenzhen (CN); Yanchao Li, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/090,405

(22) Filed: Dec. 28, 2022

(65) Prior Publication Data
US 2023/0204783 A1 Jun. 29, 2023

(30) Foreign Application Priority Data

Dec. 28, 2021 (CN) .......................... 202111632405.3
Oct. 18, 2022 (CN) .......................... 202211273831.7

(51) Int. Cl.
*G01S 17/894* (2020.01)
*G01S 7/484* (2006.01)
(Continued)

(52) U.S. Cl.
CPC ............ *G01S 17/894* (2020.01); *G01S 7/484* (2013.01); *G01S 7/4863* (2013.01); *H01L 28/10* (2013.01); *H01S 3/00* (2013.01)

(58) Field of Classification Search
CPC ...... G01S 17/894; G01S 7/484; G01S 7/4863; G01S 7/4815; G01S 17/10; H01L 28/10; H01S 3/00
See application file for complete search history.

(56) References Cited

U.S. PATENT DOCUMENTS

| 10,522,973 | B2 * | 12/2019 | Burroughs ............ H01S 5/0071 |
| 2021/0333362 | A1 * | 10/2021 | Huang .................... G01S 17/10 |

FOREIGN PATENT DOCUMENTS

| CN | 107561551 A | 1/2018 |
| CN | 107703510 A | 2/2018 |

(Continued)

OTHER PUBLICATIONS

First Office Action issued in related Chinese Application No. 202211273831.7, dated Nov. 25, 2022, 39 pages.
(Continued)

*Primary Examiner* — Isam A Alsomiri
*Assistant Examiner* — Sanjida Naser
(74) *Attorney, Agent, or Firm* — BAYES PLLC

(57) ABSTRACT

The present disclosure provides a laser emitting module and a LiDAR apparatus. The laser emitting module includes at least two groups of laser emitting circuits. Each group of the laser emitting circuits includes one charging energy storage circuit and at least one energy releasing circuit. The energy releasing circuit includes an energy releasing switch and at least one laser. The energy releasing switch is turned on to drive at least one laser to work correspondingly. The charging energy storage circuit and the energy releasing circuit are arranged one-to-one or one-to-multiple. Any two adjacent emissions correspond to different groups of the laser emitting circuits.

7 Claims, 16 Drawing Sheets

(51) Int. Cl.
G01S 7/4863 (2020.01)
H01L 49/02 (2006.01)
H01S 3/00 (2006.01)

(56) References Cited

FOREIGN PATENT DOCUMENTS

| | | | |
|---|---|---|---|
| CN | 207586427 U | | 7/2018 |
| CN | 209167536 U | * | 7/2019 |
| CN | 110333496 A | | 10/2019 |
| CN | 111077528 A | | 4/2020 |
| CN | 111856429 A | | 10/2020 |
| CN | 214754672 U | | 11/2021 |
| CN | 114114287 A | | 3/2022 |
| CN | 216624871 U | | 5/2022 |
| CN | 114594453 A | | 6/2022 |
| CN | 217278913 U | | 8/2022 |
| WO | WO-2021088647 A1 | * | 5/2021 |

OTHER PUBLICATIONS

First Office Action issued in related Chinese Application No. 202111632405.3, dated Sep. 7, 2023, 8 pages.

* cited by examiner

LASER EMITTING MODULE AND LIDAR APPARATUS

CROSS-REFERENCE TO RELATED APPLICATION

The present application claims the benefit of priority to China Patent Application No. CN 202111632405.3, filed on Dec. 28, 2021, and to Chinese Patent Application No. CN 202211273831.7, filed on Oct. 18, 2022, the contents of which are incorporated herein by reference in their entireties.

TECHNICAL FIELD

The present disclosure belongs to the technical field of LiDAR, and in particular, relates to a laser emitting module and a LiDAR apparatus.

TECHNICAL BACKGROUND

With continuous development of laser detection technologies, LiDAR apparatuses are applied to broader fields.

A working principle of the LiDAR apparatus is as follows. A plurality of lasers emit laser pulses. The laser pulses are incident on an object to be measured and reflected back to a laser receiving module. A control module determines distance information of the object to be measured according to time of flight of a laser beam.

In a conventional LiDAR apparatus, a laser is connected to a corresponding charging and discharging circuit. The charging and discharging circuit drives the laser to emit the laser pulses. A charging circuit and a discharging circuit are arranged one-to-one in the charging and discharging circuit. Each charging and discharging circuit drives one laser to work.

However, with demand for high resolution, the number and density of the lasers increase accordingly. When the laser is connected to a corresponding drive circuit one-to-one, the number of charging and discharging circuits also increases, thereby increasing complexity of a circuit configuration. With the complex circuit configuration, costs of the laser emitting module also increase, and wiring becomes more difficult, which limits development of high resolution of the laser emitting module. In addition, when the circuit configuration is more complex, heat accumulation is likely to occur in the circuit, thereby causing poor channel consistency.

SUMMARY

The present disclosure is intended to provide a laser emitting module, to solve a problem that a conventional LiDAR apparatus with improved vertical resolution has a complex circuit and poor channel consistency.

A first aspect of the embodiment of the present disclosure provides a laser emitting module, including:
  at least two groups of laser emitting circuits;
  each group of laser emitting circuits includes one charging energy storage circuit and at least one energy releasing circuit, and the charging energy storage circuit is triggered at intervals to charge and work by a corresponding charging signal;
  any one of the energy releasing circuits includes an energy releasing switch and at least one laser connected in series, the energy releasing circuit is triggered to connect by a corresponding discharge signal, to drive the at least one laser in the energy releasing circuit to emit a laser pulse toward a corresponding field of view; and
  any two adjacent emissions correspond to different groups of laser emitting circuits.

In some embodiments, the laser emitting module further includes a laser emitting board;
  when a group of laser emitting circuits includes the plurality of energy releasing circuits, the plurality of energy releasing circuits are located on the same laser emitting board or different laser emitting boards; and
  lasers are arranged on the laser emitting board corresponding to staggered optical emitting angles.

In some embodiments, when any one of the energy releasing circuits includes the plurality of lasers, the plurality of lasers and the energy releasing switch are connected in series, or the plurality of lasers and an output end of the energy releasing switch are connected in parallel.

In some embodiments, the charging energy storage circuit includes an inductor, a first electronic switch transistor, a diode, and a capacitor;
  a first end of the inductor forms a power supply input end of the charging energy storage circuit, a second end of the inductor, an anode of the diode, and a drain electrode of the first electronic switch transistor are connected together, a gate electrode of the first electronic switch transistor forms a controlled end of the charging energy storage circuit, a source electrode of the first electronic switch transistor is grounded, a cathode of the diode and a first end of the capacitor are connected to form a power supply output end of the charging energy storage circuit, and a second end of the capacitor is grounded;
  each of the energy releasing switches includes a second electronic switch transistor; and
  a drain electrode, a gate electrode and a source electrode of the second electronic switch transistor form a power supply input end, a controlled end, and a power supply output end of the energy releasing switch respectively.

In some embodiments, the laser emitting board includes a first side surface and a second side surface that are arranged oppositely; and
  for each laser emitting board, a binding region is provided in at least one of an edge region of the first side surface and a same edge region of the second side surface, and a plurality of lasers are sequentially bound at intervals to the binding region along a vertical region corresponding to a field of view.

In some embodiments, for each laser emitting board, at least one group of laser emitting circuits is correspondingly arranged on at least one of the first side surface and the second side surface.

In some embodiments, the laser emitting module further includes:
  a fixing bracket, where the fixing bracket is configured to fix and install the plurality of laser emitting boards, where
    the fixing bracket includes a plurality of fixing portions oppositely arranged and a connecting portion vertically connected to the plurality of fixing portions; and
    a plurality of limiting portions are oppositely arranged on the plurality of fixing portions respectively, the plurality of limiting portions are arranged parallel to the connecting portions sequentially at intervals, and the limiting portions oppositely arranged are configured to limit and install the laser emitting board.

In some embodiments, there are four fixing portions, and the four fixing portions are vertically fixedly installed at four diagonal corners of the connecting portion; and the limiting portions of the four fixing portions are positioned and installed at diagonal conner positions of the corresponding laser emitting board.

A second aspect of an embodiment of the present disclosure provides a LiDAR apparatus, including a laser receiving module, a main control module, and a laser emitting module as described above, where the main control module is connected to the laser receiving module and the laser emitting module respectively and configured to output a drive control signal to drive the laser emitting module to emit laser pulses according to a preset timing sequence;

the laser receiving module and the laser emitting module are correspondingly provided;

the laser receiving module is configured to receive a plurality of laser pulses reflected back and convert the laser pulses into a plurality of corresponding echo signals; and the main control module is configured to determine distance information of an object to be measured according to the corresponding echo signals.

In some embodiments, the laser receiving module includes a receiving board; and a plurality of photoelectric converters corresponding to a plurality of lasers are arranged on the receiving board, and the plurality of photoelectric converters are arranged into an array.

A third aspect of the present disclosure provides a laser emitting device, including at least one laser emitting board and at least one optical fiber;

a plurality of laser emitting units are arranged on a first surface and a second surface of the laser emitting board respectively, the plurality of laser emitting units are arranged side by side along an upper edge of the laser emitting board, and the first surface is located at an opposite side of the second surface; and the optical fiber is arranged on a cross section of the upper edge of the laser emitting board, and configured to focus optical paths of the plurality of laser emitting units on the first surface and the second surface of the laser emitting board.

In some embodiments, there are the plurality of laser emitting boards. The plurality of laser emitting boards are arranged in parallel. A second surface of an $n^{th}$ emitting board and a first surface of an (n+1)th emitting board are arranged oppositely, where n is an integer greater than or equal to 1.

In some embodiments, the laser emitting device includes four laser emitting boards. 16 laser emitting units are arranged on the first surface and the second surface of each of the laser emitting boards respectively. The plurality of laser emitting boards work concurrently in a plurality of wires. 32 laser emitting units on each of the laser emitting boards work in series.

In some embodiments, the laser emitting unit includes a modular circuit. The modular circuit includes a light emitting source, a driver, and a variable voltage source. A light outlet of the light emitting source is arranged on the upper edge of the laser emitting board. The driver and the variable voltage source are arranged on the laser emitting board. The variable voltage source is configured to output voltage signals according to control signals. The driver is configured to generate drive signals according to the voltage signals. The light emitting source is configured to output a laser according to the drive signals.

In some embodiments, the laser emitting device further includes a control unit. The control unit is connected to a variable voltage source of the laser emitting unit via a flexible flat cable or a coaxial wire. The control unit is configured to send the control signals to the variable voltage source of the laser emitting unit according to a preset control logic.

In some embodiments, the laser emitting units in the same row on the first surface and the second surface of the laser emitting board are arranged in a staggered manner along a vertical field of view; and/or the laser emitting units in the same row between the respective laser emitting boards are arranged in a staggered manner along the vertical field of view.

In some embodiments, the plurality of laser emitting boards are arranged at a preset angle so that outgoing laser beams of different laser emitting boards are at the preset angle.

In some embodiments, a position of the laser emitting unit is determined by an emitting angle of the field of view of the laser emitting device and a preset detection distance range.

In some embodiments, the laser emitting board is also provided with a positioning hole. The positioning hole is configured to position each of the laser emitting units on the first surface and the second surface of the laser emitting board.

In some embodiments, the optical fiber is fixed on the cross section of the upper edge of the laser emitting board through glue dispensing.

In some embodiments, there is provided a LiDAR, which includes a laser emitting device.

A fourth aspect of the present disclosure provides an intelligent apparatus, including a LiDAR system.

Compared with the related art, the embodiments of the first and second aspects have the following benefits. The laser emitting module is provided with at least two groups of laser emitting circuits. Each group of laser emitting circuits includes one charging energy storage circuit and at least one energy releasing circuit. The energy releasing circuit includes an energy releasing switch and at least one laser. The energy releasing switch is turned on to drive a laser group to work correspondingly. The charging energy storage circuit and the energy releasing circuit are arranged one-to-one or one-to-multiple. High vertical resolution is realized, a circuit configuration of the laser emitting module is simplified, and design costs are reduced. In addition, any two adjacent emissions correspond to different groups of laser emitting circuits, and therefore, heat dissipation performance of the same laser emitting circuit is improved, thereby reducing heat accumulation and improving channel consistency.

The laser emitting devices in embodiments of the third aspect and the fourth aspect include, via the laser, at least one laser emitting board and at least one optical fiber. There are a plurality of laser emitting units on the first surface and the second surface of the laser emitting board respectively. The plurality of laser emitting units are arranged side by side along the upper edge of the laser emitting board. The first surface is located on an opposite side of the second surface. The optical fiber is arranged on the cross section of the upper edge of the laser emitting board and configured to focus the optical paths of the plurality of laser emitting units. With this arrangement, not only the resolution is improved, but also a volume of the entire laser emitting device can be effectively reduced, thereby improving space utilization.

Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty.

Further, modular circuits are provided so that electrical performance of each of the laser emitting units is effectively guaranteed to be consistent.

Further, by modularizing the laser emitting board, an angle of each of the laser emitting units on the laser emitting board can be adjusted only by adding the laser emitting board when a channel needs to be expanded, thus simplifying a structure of the laser emitting device.

The foregoing descriptions are only brief descriptions of the technical solutions in the embodiments of the present disclosure. To understand the technical solutions in the embodiments of the present disclosure more clearly for implementation of the technical solutions according to the content of the specification, and to make the foregoing and other objectives, features and advantages of the embodiments of the present disclosure more apparent and understandable, specific implementations of the present disclosure are illustrated in more detail below.

DETAILED DESCRIPTION

Figure 1:
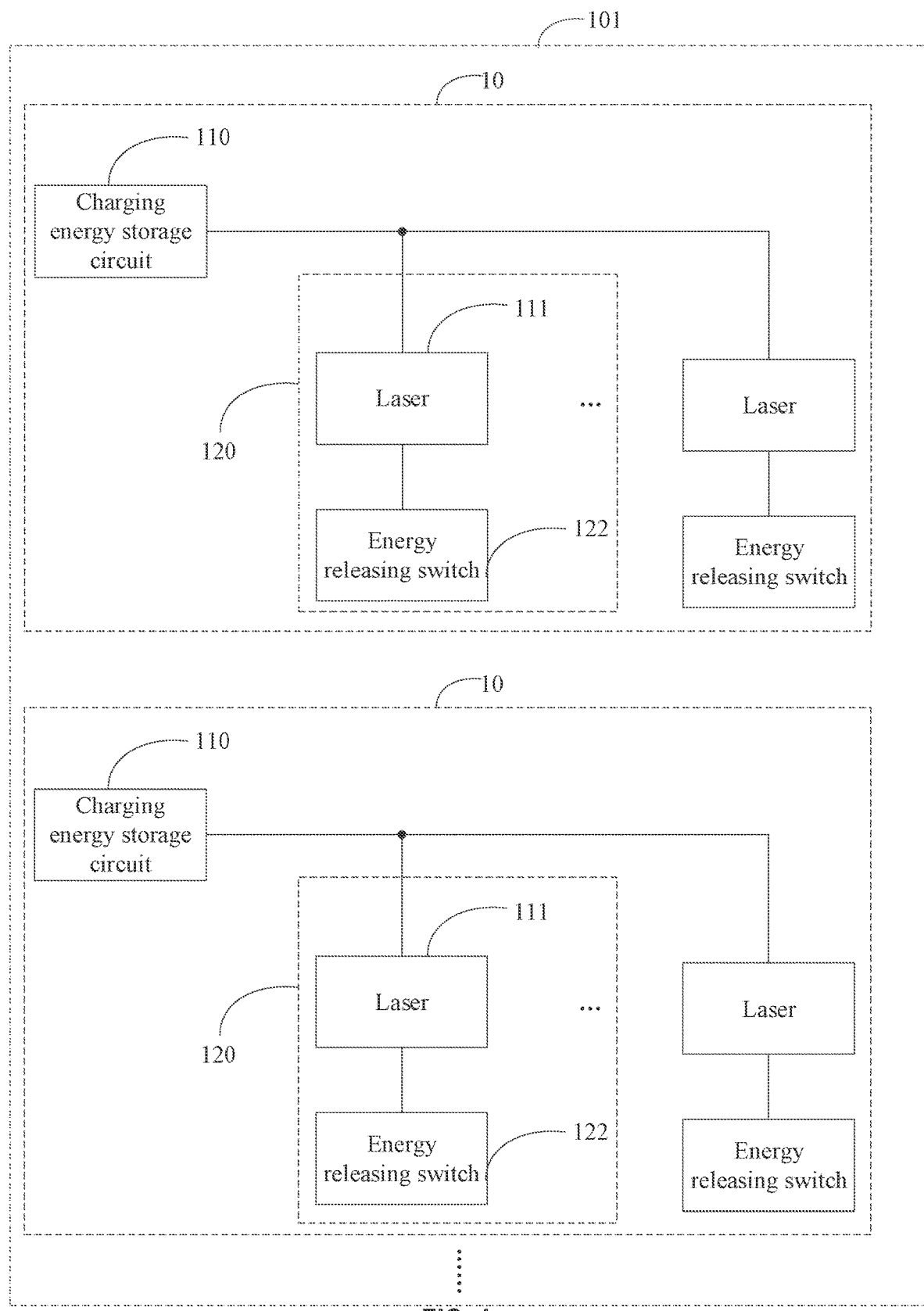
FIG. 1 is a schematic diagram of a laser emitting circuit in a laser emitting module according to an embodiment of the present disclosure.

In order to make the technical problems to be solved in the present disclosure, the technical solution and the benefits more clear and understandable, the present disclosure is further described in detail below in conjunction with the drawings and embodiments. It should be understood that the specific embodiments described herein are only used to explain the present disclosure, but not to limit the present disclosure.

It should be noted that when an element is called "fixed" or "arranged" at another element, the element can be directly on another element or indirectly on another element. When one element is referred to as being "connected" to another element, the element can be directly connected to or indirectly connected to that another element.

It should be understood that the orientation or positional relationship indicated by the terms such as "length", "width", "upper", "lower", "front", "rear", "left", "right", "vertical", "horizontal", "top", "bottom", "inner", "outer", etc. are based on orientation or positional relationship shown in the drawings, and are only for the convenience of describing the present disclosure and simplifying the description, rather than indicating or implying that a device or element referred to should have a specific orientation, be configured and operated in a specific orientation, and therefore cannot be understood as a limitation to the present disclosure.

In addition, the terms such as "first" and "second" are merely intended for a purpose of description, and shall not be understood as an indication or implication of relative importance or implicit indication of a quantity of indicated technical features. Thereby, features defined as "first" and "second" can explicitly or implicitly include one or more of the features. In the description of the present disclosure, "a plurality of" means two or more, unless expressly specified otherwise.

A first aspect of an embodiment of the present disclosure provides a laser emitting module 101. The laser emitting module 101 is arranged correspondingly with a corresponding laser receiving module 20. The laser emitting module 101 triggers and outputs a plurality of laser pulses according to a drive control signal. The laser receiving module 20 receives the reflected laser pulses and converts the reflected laser pulses into corresponding echo signals. A corresponding processor or controller determines distance information of an object 100 to be measured according to emitting time and receiving time of the laser pulses.

As shown in FIG. 1, in this embodiment, the laser emitting module 101 includes at least two groups of laser emitting circuits 10.

Each group of laser emitting circuits 10 includes one charging energy storage circuit 110 and at least one energy releasing circuit 120. The charging energy storage circuit 110 is triggered at intervals to charge and work by corresponding charging signals.

Any one of the energy releasing circuits 120 includes an energy releasing switch 122 and at least one laser 111 connected in series. At least one laser 111 is connected to the energy release circuit 120. The energy releasing circuit 120 is triggered to connect by a corresponding discharge signal, to drive the at least one laser 111 in the energy releasing circuit 120 to emit a laser pulse toward a corresponding field of view.

Any two adjacent emissions correspond to different groups of laser emitting circuits 10.

In the embodiment, the laser emitting circuit 10 can be provided with one energy releasing circuit 120 or a plurality of energy releasing circuits 120. In addition, the number of energy releasing circuits 120 provided in each of the laser emitting circuit 10 can be equal or unequal. For example, when three groups of laser emitting circuits 10 are included, a first group of laser emitting circuits 10 includes one energy releasing circuit 120. A second group of laser emitting circuits 10 includes two energy releasing circuits 120. A third group of laser emitting circuits 10 includes three energy releasing circuits 120. Meanwhile, when one of the laser emitting circuits 10 includes a plurality of energy releasing circuits 120, the plurality of energy releasing circuits 120 are connected in parallel to an output end of the charging energy storage circuit 110 of the laser emitting circuit 10.

It should be understood that the number of energy releasing circuits 120 included in each of the laser emitting circuits 10 is related to charging energy of the charging energy storage circuit 110, power demand and circuit loss of each of the energy releasing circuits 120. For example, when the charging energy of the charging energy storage circuit 110 of each of the laser emitting circuits 10 is relatively small, and the power demand required by the energy releasing circuit 120 is high, the laser emitting circuit 10 includes a small number of energy releasing circuits 120.

It should be understood that the power demand required by the energy releasing circuit 120 is related to an arrangement position of the laser 111 of the corresponding energy releasing circuit 120. When the laser 111 corresponding to the energy releasing circuit 120 is located in a central field of view of a LiDAR, that is, the detection area corresponding to the laser 111 is in a LiDAR ROI region, demand for detection distance of the laser 111 is high, and demand for power required by the energy releasing circuit 120 is high. Therefore, the laser emitting circuit 10 in the center field of view includes less energy releasing circuits 120 than the energy releasing circuits 120 corresponding to the laser emitting circuits 10 in an edge field of view. Therefore, the number of potential energy circuits 120 included in the laser emitting circuit 10 can be set according to an arrangement position of the laser 111 in the detection field of view in each of the energy releasing circuits corresponding to each of the laser emitting circuits. In addition, each of the energy releasing circuits 120 includes an energy releasing switch 122 and at least one laser 111 connected in series. When one group of laser emitting circuits 10 works, the charging energy storage circuit 110 receives the corresponding drive power supply and the charging signals to trigger charging and energy storage at intervals according to a corresponding timing sequence. After the charging and the energy storage are finished each time, one of the energy releasing switches 122 is triggered and turned on to discharge, and at least one corresponding connected laser 111 is powered up while emitting laser pulses. That is, one charging energy storage circuit 110 can trigger at least one laser emission. The number of emissions of each of the laser emitting circuits 10 and the number of pulses emitted each time are related according to the number of energy releasing circuits 120 and the lasers 111. For example, when two groups of laser emitting circuits 10 are included, the first group of laser emitting circuits 10 includes one energy releasing circuit 120, and the energy releasing circuit 120 includes one laser 111, the laser emitting circuit 10 can trigger one laser emission to emit one single laser pulse.

The second group of laser emitting circuits 10 includes two energy releasing circuits 120. A first energy releasing circuit 120 includes one laser 111. A second energy releasing circuit 120 includes two lasers 111. Therefore, the second group of laser emitting circuits 10 can trigger two laser emissions, one with one laser pulse at a time and the other with two laser pulses at a time. There is no limitation specifically to the number of emissions and the number of emission pulses.

In addition, when the laser emitting module 101 emits, two adjacent emissions are triggered by different groups of laser emitting circuits 10. For example, when three groups of laser emitting circuits 10 are included, the first group of laser emitting circuits 10 includes one energy releasing circuit 120, the second group of laser emitting circuits 10 includes two energy releasing circuits 120, and the third group of laser emitting circuits 10 includes three energy releasing circuits 120, at least one laser pulse is firstly emitted by the energy releasing circuit 120 of the first group of laser emitting circuits 10, at least one laser pulse is secondly emitted by the first energy releasing circuit 120 of the second group of laser emitting circuits 10, at least one laser pulse is thirdly emitted by the first energy releasing circuit 120 of the third group of laser emitting circuits 10, and at least one laser pulse is fourthly emitted by the first group of laser emitting circuits 10 or by the second group of laser emitting circuits 10. Therefore, the same laser emitting circuit 10 does not continuously perform a laser emitting operation, thereby reducing heat accumulation of the laser emitting circuit 10 and improving channel consistency. It can be understood that an emitting sequence corresponding to each group of laser emitting circuits 10 is not limited.

Meanwhile, at least two groups of laser emitting circuits 10 are arranged. Each group of laser emitting circuits 10 includes one charging energy storage circuit 110 and at least one energy releasing circuit 120. The energy releasing circuit 120 includes the energy releasing switch 122 and at least one laser 111. The energy releasing switch 122 is turned on to drive a laser group to work correspondingly. The charging energy storage circuit 110 and the energy releasing circuit 120 are arranged one-to-one or one-to-multiple. High vertical resolution is realized, a circuit configuration of the laser emitting module is simplified and design costs are reduced.

Figure 2:
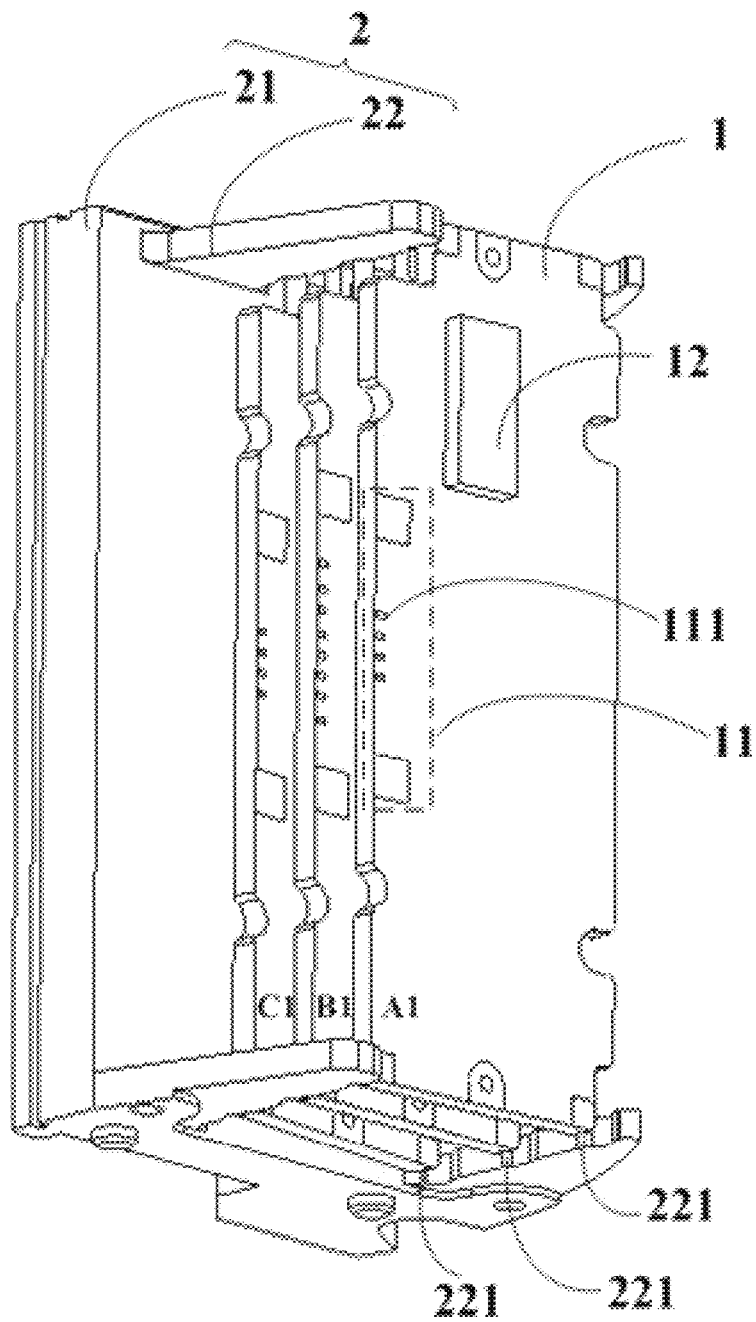
FIG. 2 is a schematic structural diagram of a first side surface of a laser emitting board in a laser emitting module according to an embodiment of the present disclosure.

In some embodiments, as shown in FIG. 2, the laser emitting module further includes a laser emitting board 1.

When a group of laser emitting circuits 10 includes the plurality of energy releasing circuits 120, the plurality energy releasing circuits 120 are located on the same laser emitting board 1 or different laser emitting boards 1.

Lasers 111 are arranged on the laser emitting board 1 corresponding to staggered optical emitting angles, thereby achieving an effect of improving vertical resolution.

Figure 3:
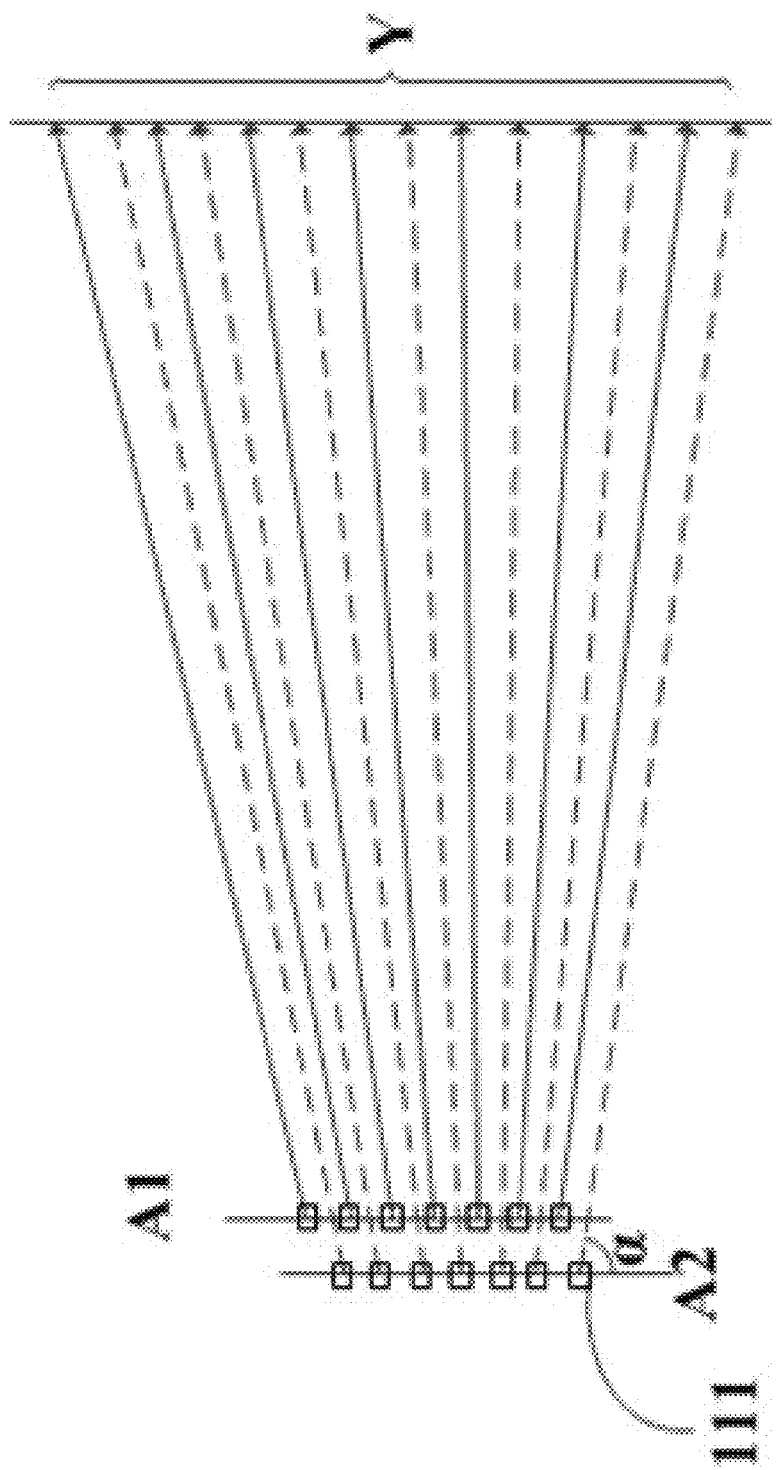
FIG. 3 is a schematic diagram of a scanning field of view of a laser emitting module according to an embodiment of the present disclosure.

In the embodiments, the laser emitting board 1 is provided with a binding region 11 corresponding to a vertical region Y of a field of view. Each binding region 11 is bound with a corresponding number of lasers 111. As shown in FIG. 3, the plurality of lasers 111 are spaced apart sequentially based on staggered optical emitting angles α corresponding to the vertical region Y of the field of view. The lasers 111 sequentially or simultaneously emit laser pulses toward the vertical region Y of the field of view at different optical emitting angles α. As shown in FIG. 3, the optical emitting angle α refers to an angle of the laser pulses relative to the vertical region Y of the field of view.

The plurality of energy releasing circuits 120 of the same group of laser emitting circuits 10 can be arranged on the same laser emitting board 1 or different laser emitting boards 1. For example, two groups of laser emitting circuits 10 are included. The first group of laser emitting circuits 10 includes two energy releasing circuits 120. The second group of laser emitting circuits 10 includes three energy releasing circuits 120. There are two laser emitting boards 1. Two energy releasing circuits 120 of the first group of laser emitting circuits 10 are arranged on the first laser emitting board 1, and three energy releasing circuits 120 of the second group of laser emitting circuits 10 are arranged on the second laser emitting board 1. Alternatively, two energy releasing circuits 120 of the first group of laser emitting circuits 10 are arranged on the first laser emitting board 1 and the second laser emitting board 1 respectively, and three energy releasing circuits 120 of the second group of laser emitting circuits 10 are all arranged on the second laser emitting board 1. A specific arrangement manner is not limited. For example, the three energy releasing circuits 120 of the same group of laser emitting circuits 10 can be provided on a first side surface and/or a second side surface of the second laser emitting board 1. The first side surface and the second side surface of the second laser emitting board 1 are regions where the same edge regions of a light emitting surface of the second laser emitting board 1 are arranged opposite to each other.

In addition, when there are the plurality of energy releasing circuits 120 of the same group of laser emitting circuits 10 on the same laser emitting board 1, the plurality of corresponding energy releasing circuits 120 emit in a corresponding pulse emitting sequence, that is, any two adjacent emissions correspond to different groups of laser emitting circuits 10.

For example, when two groups of laser emitting circuits 10 are included, the first group of laser emitting circuits 10 includes two energy releasing circuits 120, and the second group of laser emitting circuits 10 includes three energy releasing circuits 120, at least one laser pulse is firstly emitted by the first energy releasing circuit 120 of the first group of laser emitting circuits 10 provided on a first laser emitting board 1, at least one laser pulse is secondly emitted by the first energy releasing circuit 120 of the second group of laser emitting circuits 10 provided on a second laser emitting board 1, at least one laser pulse is thirdly emitted by the second energy releasing circuit 120 of the first group of laser emitting circuits 10 provided on the first laser emitting board 1, at least one laser pulse is fourthly emitted by the second energy releasing circuit 120 of the second group of laser emitting circuits 10 provided on the second laser emitting board 1, at least one laser pulse is fifthly emitted by the first energy releasing circuit 120 of the first group of laser emitting circuits 10 provided on the first laser emitting board 1, and at least one laser pulse is sixthly emitted by a third energy releasing circuit 120 of the second group of laser emitting circuits 10 provided on the second laser emitting board 1. Therefore, neither the same laser emitting board 1 nor the same laser emitting circuit 10 continuously performs a laser emitting operation, thereby reducing heat accumulation in the laser emitting circuit 10 and improving channel uniformity.

Alternatively, when there are the plurality of energy releasing circuits 120 of the same group of laser emitting circuits 10 on different laser emitting boards 1, the pulse emitting sequence makes the following possible. That is, any two adjacent emissions correspond to different groups of laser emitting circuits 10, and emitters corresponding to any two adjacent emissions are located at different laser emitting boards 1 or at different regions of the laser emitting board 1, so that heat accumulation caused by operation of an emitter of the laser emitting circuit 10 can be further reduced, and channel consistency can be improved.

For example, when two groups of laser emitting circuits 10 are included, the first group of laser emitting circuits 10 includes the first energy releasing circuit 120 and the second energy releasing circuit 120, and the second group of laser emitting circuits 10 includes the third energy releasing circuit 120 and a fourth energy releasing circuit 120, two energy releasing circuits 120 of the first group of laser emitting circuits 10 are arranged on the first laser emitting board 1 and the second laser emitting board 1 respectively, and two energy releasing circuits 120 of the second group of laser emitting circuits 10 are arranged on the first laser emitting board 1 and the second laser emitting board 1 respectively. That is, the first laser emitting board 1 is provided with the first energy releasing circuit 120 and the third energy releasing circuit 120, and the second laser emitting board 1 is provided with the second energy releasing circuit 120 and the fourth energy releasing circuit 120.

During emission, at least one laser pulse is firstly emitted by the first energy releasing circuit 120 on the first laser emitting board 1, at least one laser pulse is secondly emitted by the third energy releasing circuit 120 on the first laser emitting board 1 or by the fourth energy releasing circuit 120 on the second laser emitting board 1, at least one laser pulse is thirdly emitted by the second energy releasing circuit 120 on the second laser emitting board 1, and at least one laser pulse is fourthly emitted by the fourth energy releasing circuit 120 on the first laser emitting board 1 or the third energy releasing circuit 120 on the second laser emitting board 1. Therefore, the same laser emitting circuit 10 does not continuously perform a laser emitting operation, thereby reducing the heat accumulation of the laser emitting circuit 10 and improving the channel uniformity.

Figure 4:
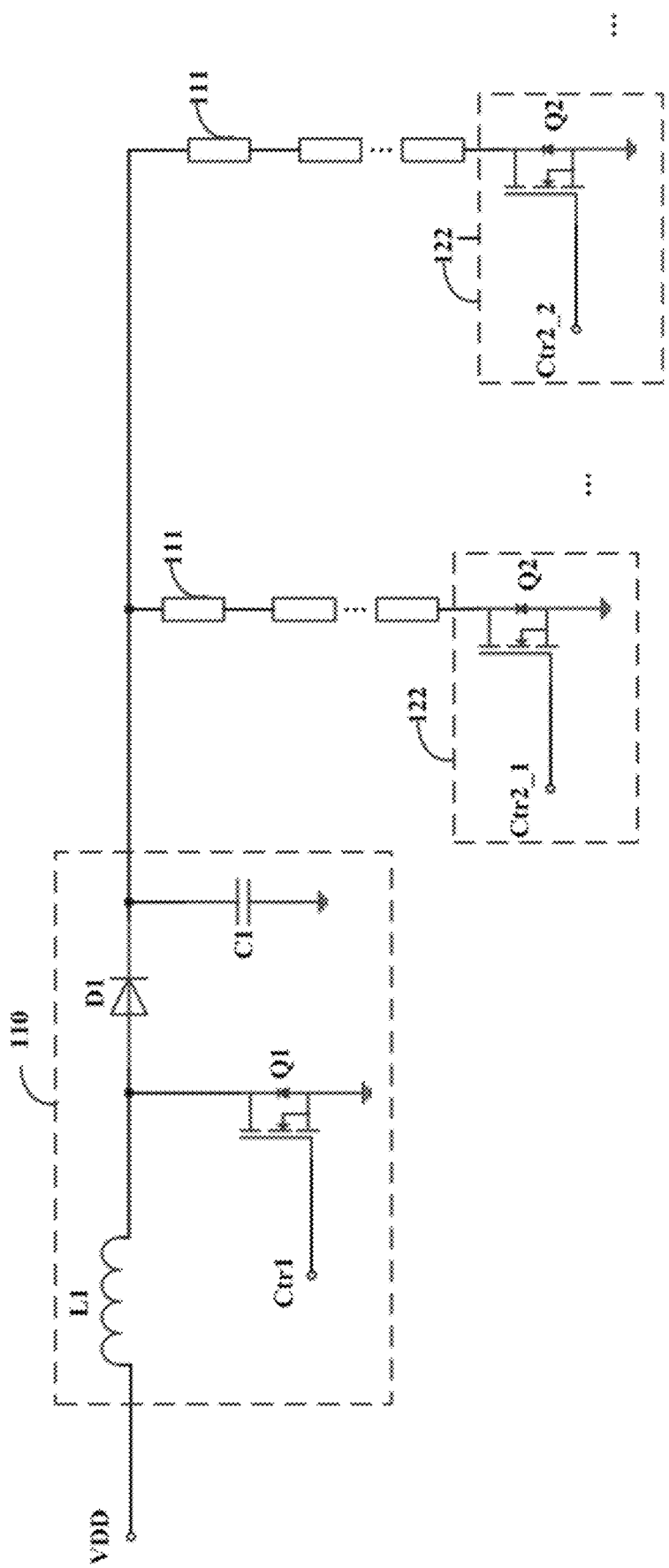
FIG. 4 is a schematic diagram of a first example of a laser emitting circuit according to an embodiment of the present disclosure.
Figure 5:
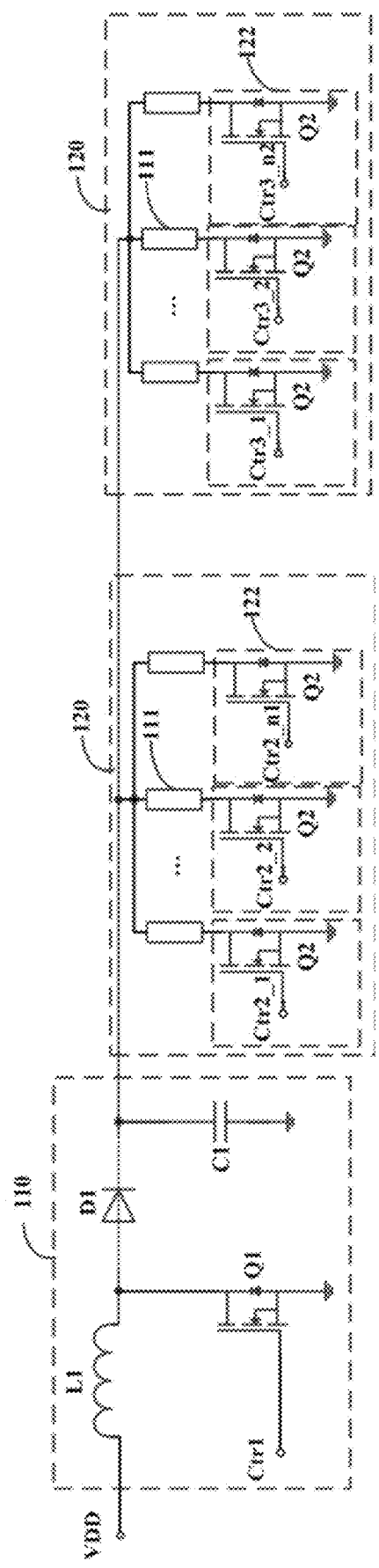
FIG. 5 is a schematic diagram of a second example of a laser emitting circuit according to an embodiment of the present disclosure.
Figure 6:
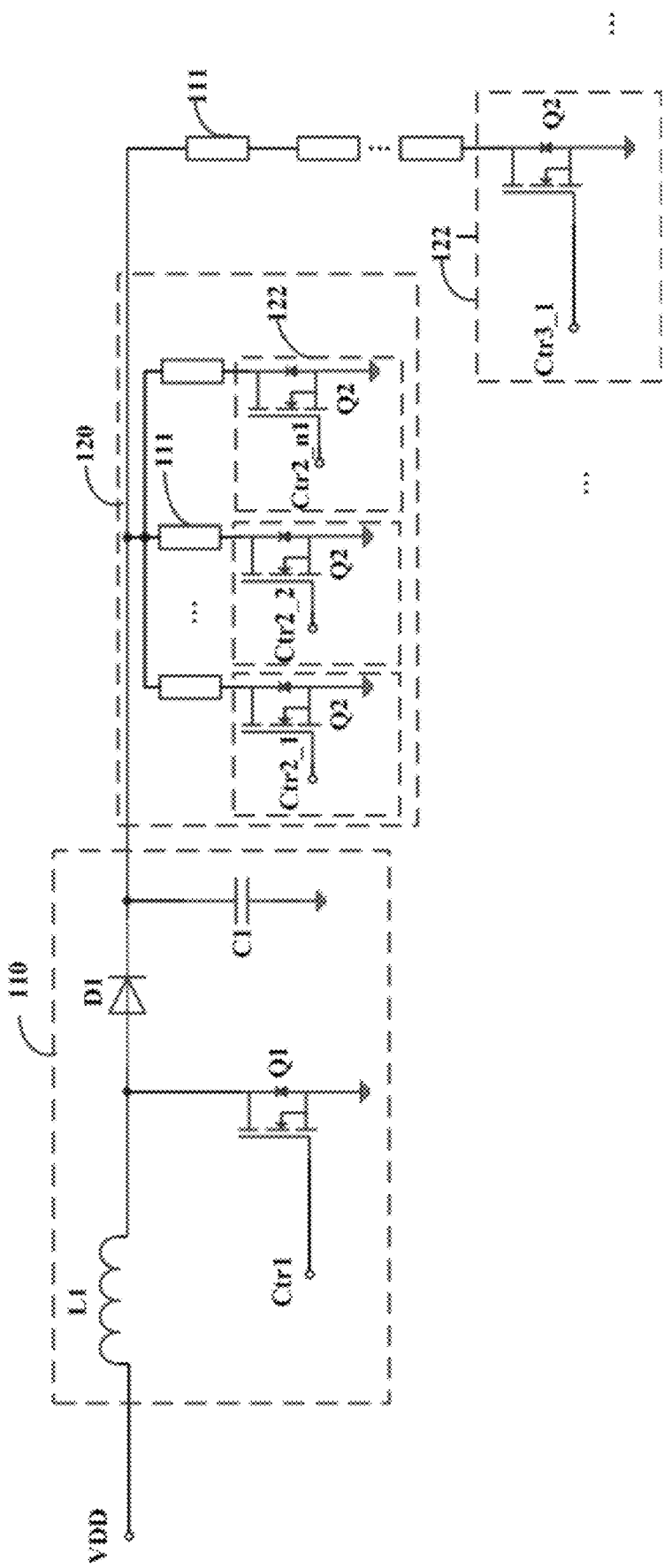
FIG. 6 is a schematic diagram of a third example of a laser emitting circuit according to an embodiment of the present disclosure.

In some embodiments, as shown in FIG. 4 to FIG. 6, when any one of the energy releasing circuits 120 includes the plurality of lasers 111, the plurality of lasers 111 and the energy releasing switch 122 are connected in series, or the plurality of lasers 111 and an output end of the energy releasing switch 122 are connected in parallel.

In the embodiments, after being connected in series or in parallel, the plurality of lasers 111 in the energy releasing circuit 120 and the energy releasing switch 122 in the energy releasing circuit 120 are connected in series. When the energy releasing circuit 120 emits the laser pulses, the corresponding energy releasing switch 122 drives the plurality of lasers 111 to simultaneously emit the laser pulses.

In addition, when there are the plurality of energy releasing circuits 120, connection and arrangement manners of the laser 111 and the energy releasing switch 122 of each of the energy releasing circuits 120 can be the same or different. For example, as shown in FIG. 4, each of the energy releasing circuits 120 includes the plurality of lasers 111 and one energy releasing switch 122 connected in series. When the plurality of energy releasing circuits 120 emit the laser pulses in a staggered manner, each of the energy releasing circuits 120 simultaneously emits the plurality of laser pulses. Alternatively, as shown in FIG. 5, the respective energy releasing circuits 120 include the plurality of lasers 111 and the plurality of energy releasing switches 122 and connected in parallel in one-to-one correspondence. Each of the energy releasing switches 122 is connected to the laser 111. When the plurality of energy releasing circuits 120 emit the laser pulses in a staggered manner, each of the energy releasing circuits 120 selectively emits any one of the laser pulses, or emits the plurality of laser pulses at the same time. Alternatively, as shown in FIG. 6, at least one energy releasing circuit 120 includes the plurality of lasers 111 and the energy releasing switch 122 connected in series. At least one energy releasing circuit 120 includes a plurality of emitting channels connected in series. Each of the emitting channels includes one or more lasers 111 and one energy releasing switch 122 connected in series. When the plurality of energy releasing circuits 120 emit the laser pulses in the staggered manner, the energy releasing circuit 120 simultaneously emits the plurality of laser pulses or selectively emits any laser pulse, thereby reducing the number of laser emitting circuits 10, simplifying a circuit configuration and reducing design costs.

Specific configurations of the charging energy storage circuit 110 and the energy releasing switch 122 can be arranged according to charging and discharging requirements. As shown in FIG. 4 to FIG. 6, in some embodiments, the charging energy storage circuit 110 includes an inductor L1, a first electronic switch transistor Q1, a diode D1, and a capacitor C1.

A first end of the inductor L1 forms a power supply input end of the charging energy storage circuit 110. A second end of the inductor L1, an anode of the diode D1, and a drain electrode of the first electronic switch transistor Q1 are connected together. A gate electrode of the first electronic switch transistor Q1 forms a controlled end of the charging energy storage circuit 110. A source electrode of the first electronic switch transistor Q1 is grounded. A cathode of the diode D1 and a first end of the capacitor C1 are connected to form a power supply output end of the charging energy storage circuit 110. A second end of the capacitor C1 is grounded.

Each of the energy releasing switches 122 includes a second electronic switch transistor Q2.

The drain electrode, the gate electrode, and the source electrode of the second electronic switch transistor Q2 form a power supply input end, a controlled end, and a power supply output end of the energy releasing switch 122 respectively.

In the embodiment, the inductor L1, the first electronic switch transistor Q1, and the diode D1 form a boost circuit. The capacitor C1 is an energy storage capacitor C1.

When the laser 111 is controlled to emit a laser at intervals, the first electronic switch transistor Q1 in the charging energy storage circuit 110 receives corresponding charging signals and is controlled to turn on and off, thereby converting and outputting a charging power supply to the energy storage capacitor C1. After charging is finished, the second electronic switch transistor Q2 is conducted. The energy storage capacitor C1 starts discharging, and discharges to the ground via the corresponding laser 111 and the second electronic switch transistor Q2. The laser 111 lights up and emits the laser. A scanning mode corresponding to resolution in the vertical region is realized by arranging a plurality of groups of transceiver photoelectric devices with different densities.

Compared with the related art, the embodiments of the present disclosure have the following benefits. The laser emitting module is provided with at least two groups of laser emitting circuits 10. Each group of laser emitting circuits 10 includes one charging energy storage circuit 110 and at least one energy releasing circuit 120. The energy releasing circuit 120 includes the energy releasing switch 122 and at least one laser 111. The energy releasing switch is turned on to drive a laser 111 group to work correspondingly. The charging energy storage circuit 110 and the energy releasing circuit 120 are arranged one-to-one or one-to-multiple. High vertical resolution is realized, a circuit configuration of the laser emitting module is simplified and design costs are reduced. In addition, any two adjacent emissions correspond to different groups of laser emitting circuits 10, and therefore, heat dissipation of the same laser emitting circuit 10 is improved, thereby reducing heat accumulation and improving channel consistency.

Figure 7:
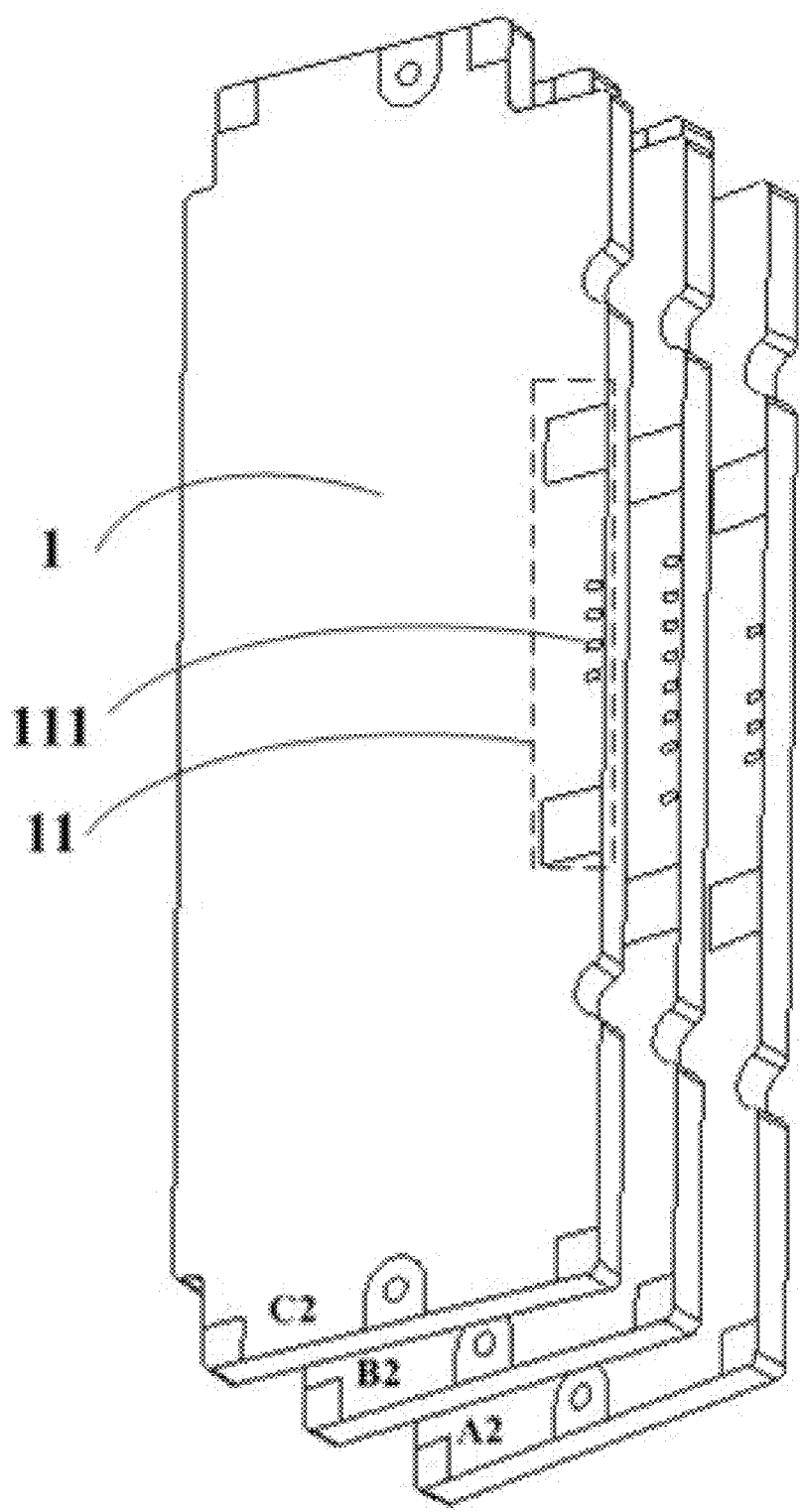
FIG. 7 is a schematic structural diagram of a second side surface of a laser emitting module according to an embodiment of the present disclosure.

In order to improve vertical resolution of a LiDAR apparatus, in some embodiments, as shown in FIG. 2 and FIG. 7, each of the laser emitting boards 1 includes a first side surface and a second side surface arranged opposite to each other, for example, first side surfaces A1, B1, C1, and second side surfaces A2, B2, C2.

Binding regions 11 are oppositely arranged in same edge regions of the first side surface and/or the second side surface of each of the laser emitting boards 1. A plurality of lasers 111 are sequentially bound at intervals to the binding regions 11 along a vertical region Y corresponding to a field of view.

To improve the vertical resolution, conventional practice is as follows. The laser 111 with a smaller size is replaced or arranged at a smaller spacing. However, this brings certain difficulty in wire layout, insulation, and isolation, and leads to more complicated wire layout. In addition, there is easily a problem of signal interference between the lasers 111. In the embodiment, two sides of the laser emitting board 1 are provided with a binding region 11 corresponding to the vertical region Y of the field of view respectively. Each binding region 11 is bound with a corresponding number of lasers 111. The plurality of lasers 111 are spaced apart sequentially based on the staggered optical emitting angles α corresponding to a vertical region Y of the field of view. The lasers 111 sequentially or simultaneously emit laser pulses at different optical emitting angles α toward the vertical region Y of the field of view. Compared with a single panel, the plurality of lasers 111 are arranged on both sides, which can improve vertical resolution of the vertical region Y of the field of view. For example, when the number of lasers 111 on each side of the laser emitting board 1 is equal, by adjusting the optical emitting angle α of each of the lasers 111, vertical resolution of a single double-sided laser emitting board 1 after scanning can be doubled compared with vertical resolution of a single single-sided laser emitting board 1.

It should be understood that the number of lasers 111 on both sides of each of the laser emitting boards 1 can be equal or unequal. When the plurality of laser emitting boards 1 are selected, the number of lasers 111 on each of the laser emitting boards 1 can be equal or unequal. The optical emitting angles α of each of the lasers 111 can be equal or unequal. The number of laser emitting boards 1, the number of lasers 111 on each side of the laser emitting boards 1, and the optical emitting angles α of the laser 111 can be specifically set according to requirements of the vertical resolution and a range of the vertical region Y of the field of view.

It can be understood that the plurality of energy releasing circuits 120 included in each group of laser emitting circuits 10 can be located on different sides of the same laser emitting board 1. It can be understood that the plurality of lasers 111 included in the same laser emitting board 1 are arranged in a staggered manner in a vertical field of view to ensure the vertical resolution. It can be understood that the plurality of energy releasing circuits 120 included in each group of laser emitting circuits 10 can also be located on the same side of the same laser emitting board 1. The present disclosure does not limit arrangement of the lasers 111 in the energy releasing circuits 120 included in each group of laser emitting circuits 10 on the laser emitting board 1.

It can be understood that as a preferred manner, while the lasers 111 corresponding to any two adjacent emissions are located in different emitting groups, the lasers 111 corresponding to any two adjacent emissions are arranged on different laser emitting boards 1 as far as possible, so that heat accumulation caused by operation of an emitter of the emitting circuit 10 can be further reduced. The vertical resolution can be improved while the channel uniformity can be further improved.

For example, when the vertical resolution needs to be increased to be twice as much as original vertical resolution, there are X1 lasers 111 in an original single-sided laser emitting board 1. In this case, when the single double-sided laser emitting board 1 is used, X1 lasers 111 are provided on each side of the single double-sided laser emitting board 1 respectively, in order not to reduce a spacing of lasers 111. The optical emitting angle α of each of the lasers 111 is adjusted correspondingly. There are 2X1 lasers 111.

Similarly, two double-sided laser emitting boards 1 can also be used. In addition, in order not to reduce a spacing between the lasers 111, there can be X1/2 lasers 111 on each side of each of the double-sided laser emitting boards 1. The optical emitting angle α of each of the lasers 111 can be adjusted correspondingly. There are totally 2X1 lasers 111, which can also achieve an objective of improving the vertical resolution by twice.

Alternatively, when the two double-sided laser emitting boards 1 are used, X1/3 lasers 111 are arranged on the first side surface and the second side surface of one laser emitting board 1. (2*X1)/3 lasers 111 are arranged on the first side surface and the second side surface of the other laser emitting board 1. The optical emitting angle α of each of the lasers 111 is adjusted correspondingly. There are totally 2X1 lasers 111, which can also achieve the objective of improving the vertical resolution by twice.

In another example, the vertical resolution to be adjusted is four times as much as the original vertical resolution, and the original single single-sided laser emitting board 1 has X1 lasers 111. When the single double-sided laser emitting board 1 is used, even if there are X1 lasers 111 on each side, the requirements are still unable to be met. At this time, two or more double-sided laser emitting boards 1 can be selected. When two double-sided laser emitting boards are selected, X1 lasers 111 are provided respectively on each side of the single double-sided laser emitting board 1. The optical emitting angle α of each of the lasers 111 is correspondingly adjusted. There are totally 4X1 lasers 111, in order to achieve an objective of improving the vertical resolution by four times. Or when more double-sided laser emitting boards are selected, the number and the optical emitting angle α of both sides of each of the laser emitting boards 1 are correspondingly set according to the vertical resolution.

Figure 8:
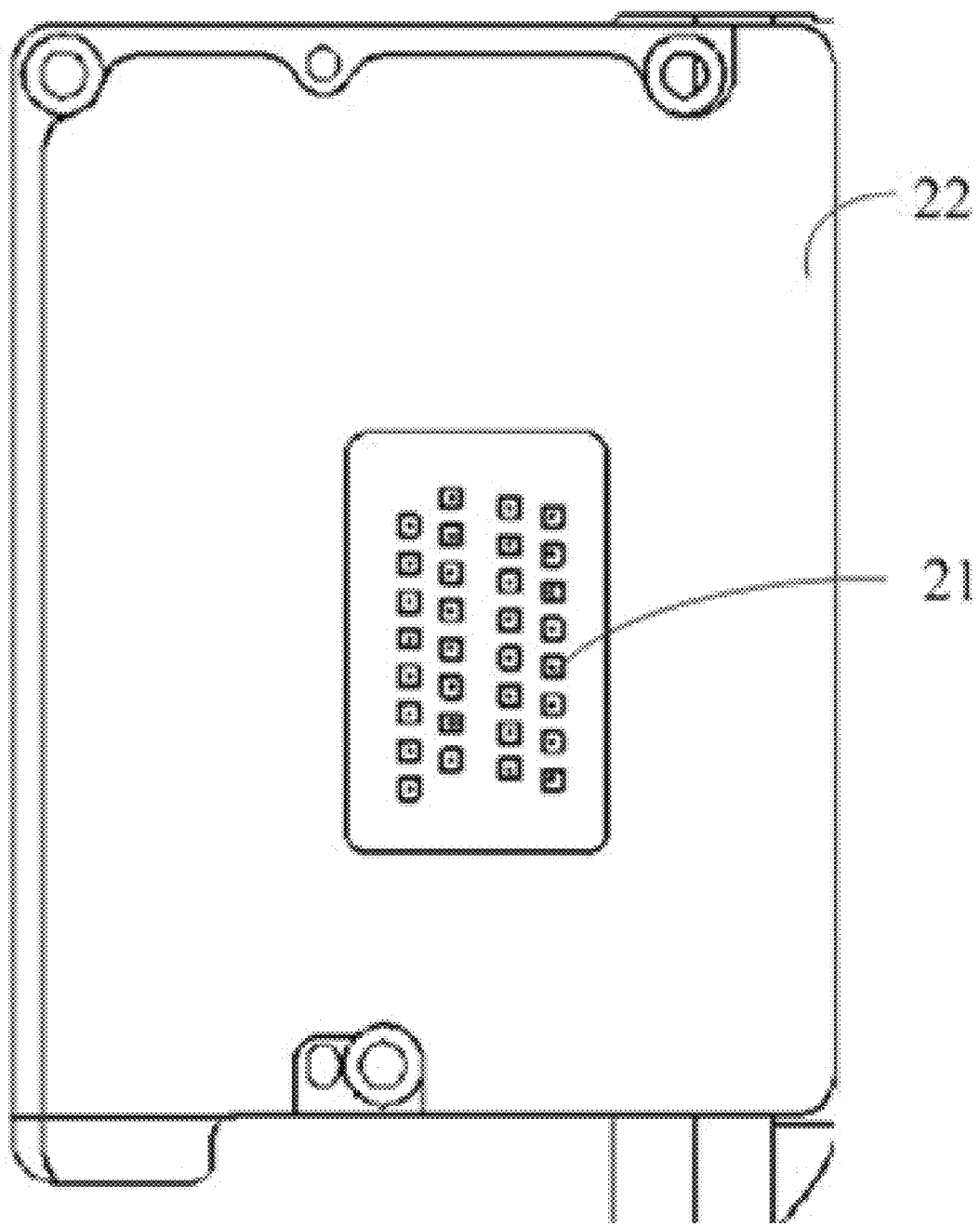
FIG. 8 is a schematic structural diagram of a laser receiving module of a LiDAR apparatus according to an embodiment of the present disclosure.

In addition, a photoelectric converter 21 of the laser receiving module 20 is arranged corresponding to a distribution mode and the number of lasers 111. As shown in FIG. 8, when the lasers 111 are arranged based on double sides in a plurality of columns, the photoelectric converters 21 of the laser receiving module 20 are arranged in accordance with a corresponding array and are arranged with the laser 111 one-to-one or multiple-to-one. Each of the photoelectric converters 21 receives corresponding laser pulses and performs photoelectric conversion into corresponding current signals. The current signals are converted into corresponding echo signals by other signal processing modules of the laser receiving module 20.

The lasers 111 are arranged on both sides of the laser emitting board 1, which can improve the vertical resolution. In addition, a size and a spacing of the lasers 111 need not be changed for each of the lasers 111 on a single side. A circuit layout is simple. Insulation between the laser 111 and a corresponding circuit is improved.

Corresponding to structures of the laser emitting board 1 and the lasers 111, in some embodiments, there are at least two groups of laser emitting circuits 10 on the first side surface and/or the second side surface of each of the laser emitting boards 1.

Figure 11:
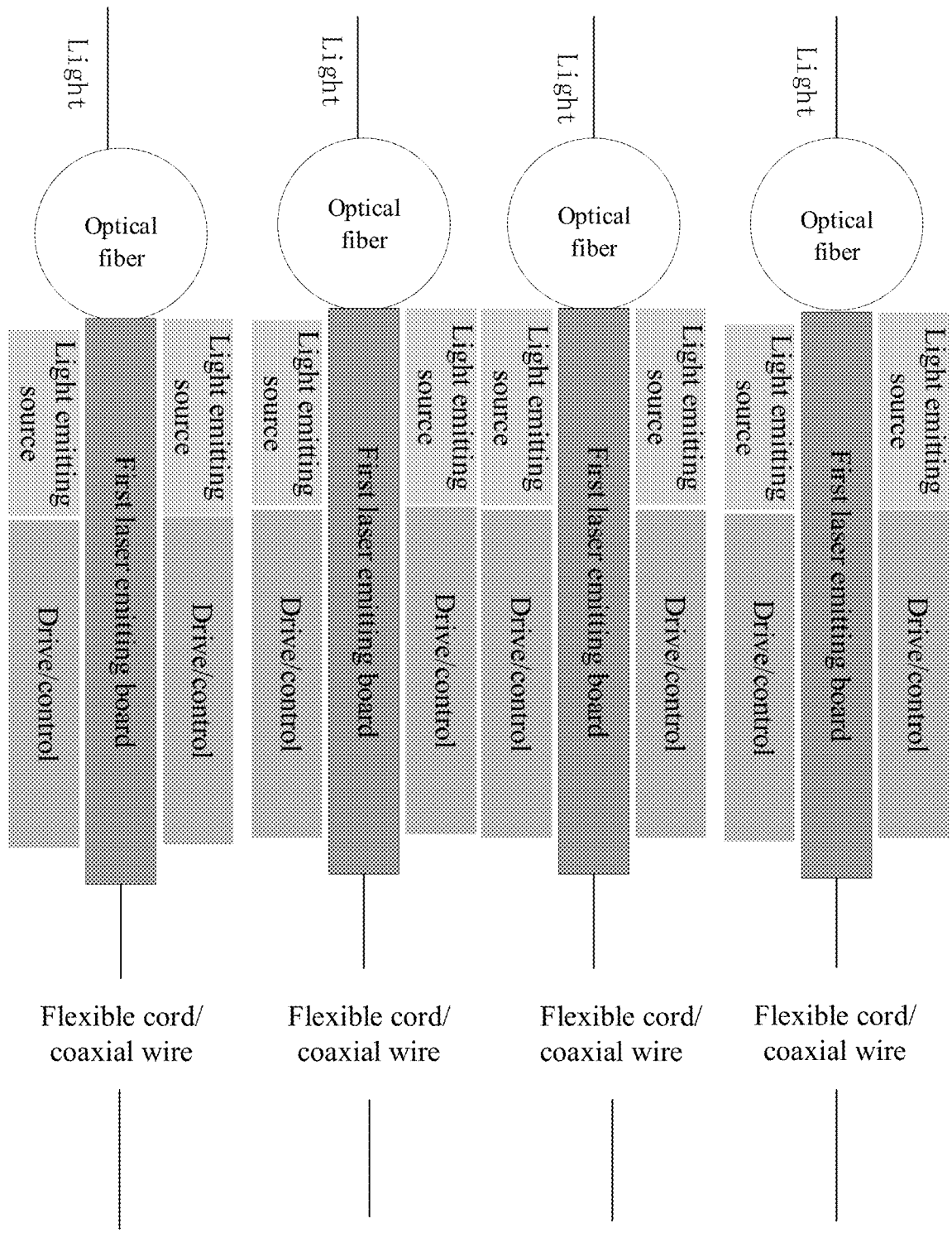
FIG. 11 is a schematic structural diagram of a laser emitting device according to another embodiment of the present disclosure.

In other embodiments of the present disclosure, an optical fiber can also be provided on a cross section of an upper edge of the laser emitting board. The optical paths of a plurality of laser emitting units are focused via the optical fiber. As shown in FIG. 11, there are a plurality of laser emitting units on the first surface and the second surface of the laser emitting board respectively. The plurality of laser emitting units are arranged side by side along the upper edge of the laser emitting board. The first surface is located on an opposite side of the second surface. The optical fiber is arranged on the cross section of the upper edge of the laser emitting board and configured to focus the optical paths of the plurality of laser emitting units. With this arrangement, a volume of the whole laser emitting device can be effectively reduced, thereby improving a space utilization rate. Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty. Further, the modular circuit is arranged so that an electrical performance of each of the laser emitting units is effectively guaranteed to be consistent. Further, by modularizing the laser emitting board, an angle of each of the laser emitting units on the laser emitting board can be adjusted only by adding the laser emitting board when a channel needs to be expanded, thus simplifying a structure of the laser emitting device.

Figure 10:
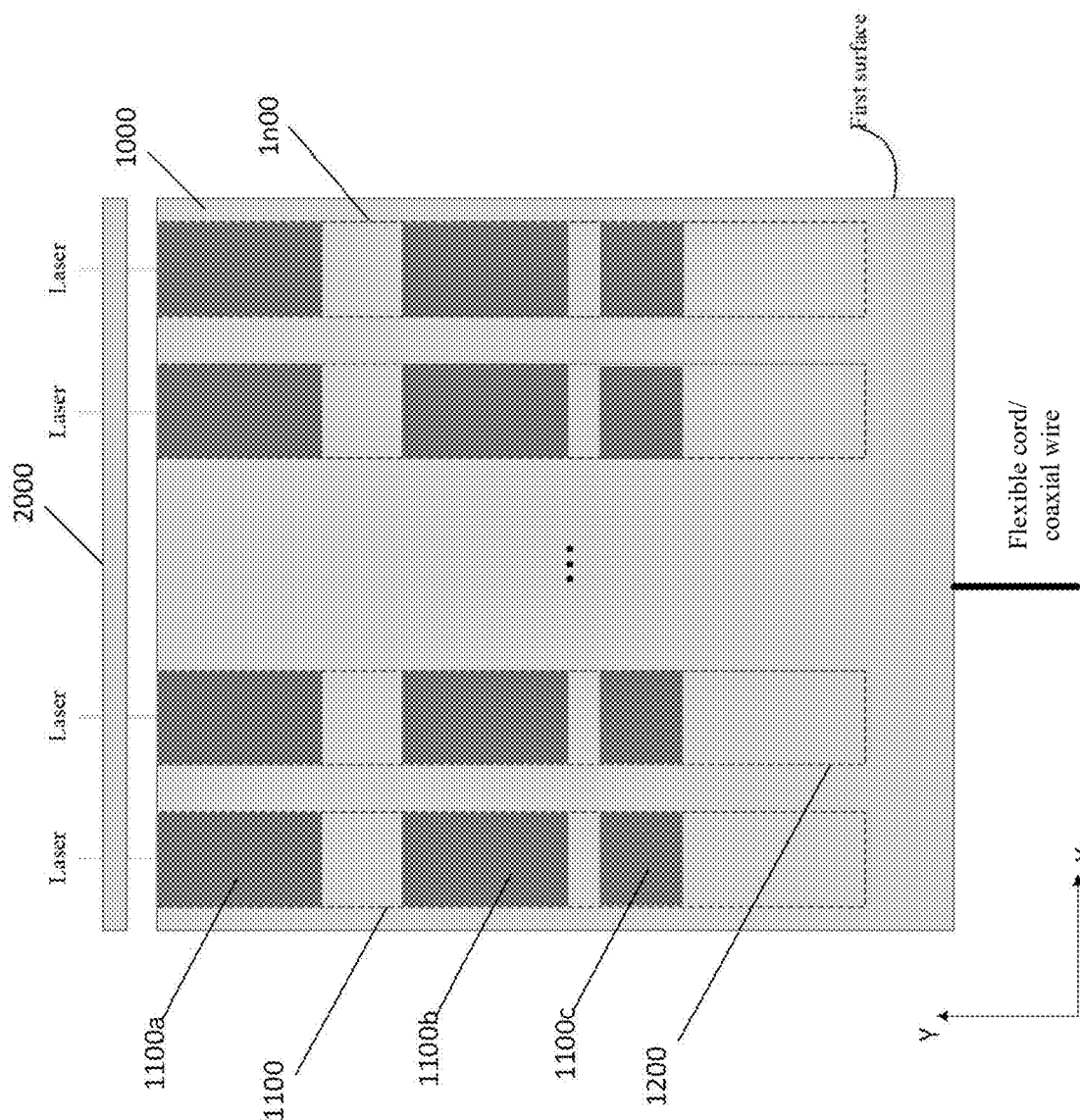
FIG. 10 is a schematic structural diagram of a laser device according to an embodiment of the present disclosure.
Figure 13:
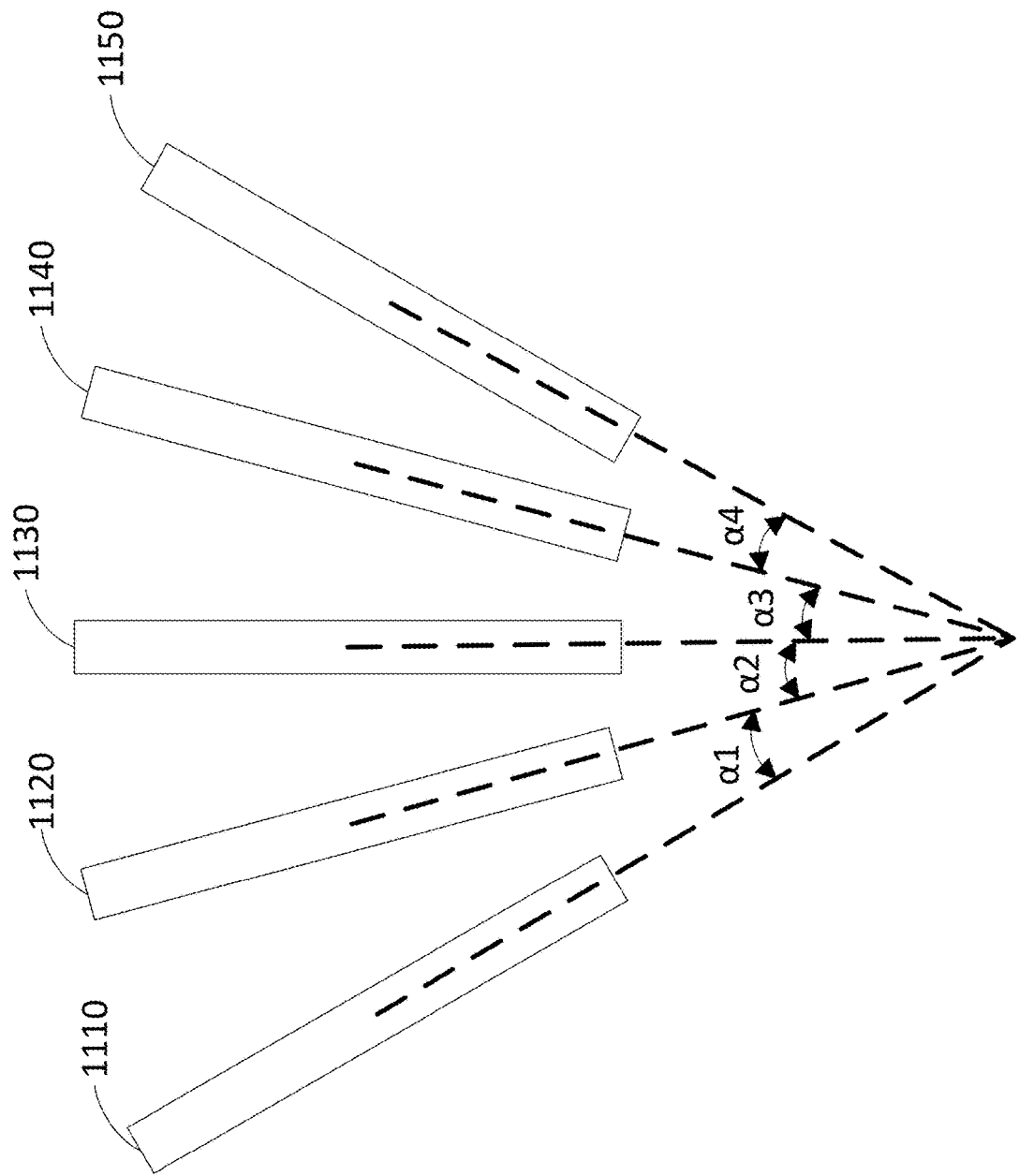
FIG. 13 is a schematic structural diagram of a laser emitting device according to another embodiment of the present disclosure.

In other embodiments of the present disclosure, the plurality of laser emitting boards are arranged at a preset angle so that outgoing laser beams of different laser emitting boards are at the preset angle. Referring to FIG. 10 and FIG. 13, in the embodiment of the present disclosure, a Y axis is parallel to a direction of the laser emitted from each of the laser emitting boards. A Y axis of each of the laser emitting boards is arranged at a preset angle, so that the outgoing laser beams of different laser emitting boards are at the preset angle. As shown in FIG. 13, an included angle between the laser emitting board 1110 and the laser emitting board 1120 is α1. An included angle between the laser emitting board 1120 and the laser emitting board 1130 is α2. An included angle between the laser emitting board 1130 and the laser emitting board 1140 is α3. An included angle between the laser emitting board 1140 and the laser emitting board 1150 is α4. This arrangement ensures a higher integration level of the laser emitting device.

In the embodiments, the laser emitting circuit 10 on each of the laser emitting boards 1 is connected to the same main control module 30 via a signal wire. The main control module 30 outputs corresponding control signals to each of the laser emitting circuits 10, thereby driving each of the lasers 111 of each of the laser emitting boards 1 to sequentially or simultaneously emit laser pulses according to a preset timing sequence.

A corresponding number of laser emitting circuits 10 can be individually arranged on one surface of the laser emitting board 1 or are arranged on both sides of the laser emitting board 1 separately according to distribution of the lasers 111. When the laser emitting circuit is arranged on one side of the laser emitting board 1, the lasers 111 on the other side are connected and driven by a via route or a cross-plane route on the laser emitting board 1. Specific arrangement and connection manners are not limited.

The laser emitting board 1 can be a circuit plate or a separate substrate structure. When the laser emitting board is the circuit plate, the first side surface and the second side surface correspond to an outer layer of a first circuit and an outer layer of the second circuit. The lasers 111 and the laser emitting circuit 10 are fixed to the outer layer of the circuit by welding or plugging. A corresponding number of laser emitting circuits 10 and the lasers 111 are connected by a signal wire or by a metal route formed by etching on the outer layer of the circuit plate, In addition, a corresponding signal interface is arranged on the circuit plate, which is correspondingly connected to a signal terminal of the main control module 30, and inputs corresponding power supply signals and control signals. Alternatively, when used as a common substrate, the lasers 111 and the laser emitting circuit 10 are fixed to the substrate by bonding or clamping. The lasers 111 and the laser emitting circuit 10 are connected by a signal route. Meanwhile, a corresponding signal interface is fixed on the substrate, which is correspondingly connected to the signal terminal of the main control module 30 and inputs the corresponding power supply signals and the control signals. A specific structure of the laser emitting board 1 can be correspondingly selected and arranged according to setting requirements of the LiDAR apparatus.

In some embodiments, in order to simplify a wire structure, the laser emitting board 1 is a circuit plate of a corresponding structure. The lasers 111 and the laser emitting circuit 10 are welded and fixed to the outer layer of the circuit. The laser emitting circuit 10 and the lasers 111 are connected by the metal route formed by etching on the outer layer of the circuit plate. Meanwhile, the corresponding signal interface is arranged on the circuit plate, which is correspondingly connected to the signal terminal of the main control module 30 and inputs the corresponding power signals and the control signals.

In some embodiments, in order to fixedly install the corresponding laser emitting board 1, as shown in FIG. 2, the laser emitting module 101 further includes a fixing bracket 2 configured to fix and install at least one laser emitting board 1.

The fixing bracket 2 includes a plurality of fixing portions 22 arranged oppositely to each other and a connecting portion 21 vertically connected to the plurality of fixing portions 22.

A plurality of limiting portions 221 are oppositely arranged on the fixing portions 22 respectively. The limiting portions 221 are arranged at intervals sequentially parallel to the connecting portions 21. The limiting portions 221 arranged oppositely are configured to limit and install a laser emitting board 1.

In this embodiment, the laser emitting board 1 is fixed to the corresponding limiting portion 221 by a clamping manner. After the laser emitting board 1 is fixed to the corresponding limiting portion 221 in a limiting manner, connecting portions 21 between the laser emitting board 1 and the fixing bracket 2 are arranged at intervals sequentially. Each of the lasers 111 emit the laser pulses according to the corresponding optical emitting angle α.

There can be two or more fixing portions 22. The limiting portions 221 of the fixing portions 22 can be in an opening shape or a groove shape. The fixing portion 22 and the connecting portion 21 can be integrally formed or removably connected. A specific structure of the fixing bracket 2 can be specifically arranged according to a volume, costs and a process of the LiDAR apparatus.

As shown in FIG. 2, in some embodiments, there are four fixing portions 22. The four fixing portions 22 are vertically, fixedly installed on four diagonal corners of the connecting portion 21. The limiting portions 221 of the four fixing portions 22 are fixedly installed on diagonal corner positions corresponding to the laser emitting board 1 in the limiting manner. The limiting portion 221 uses a groove structure. The diagonal corner positions of the laser emitting board 1 are clamped, connected, and fixed to a groove.

Figure 9:
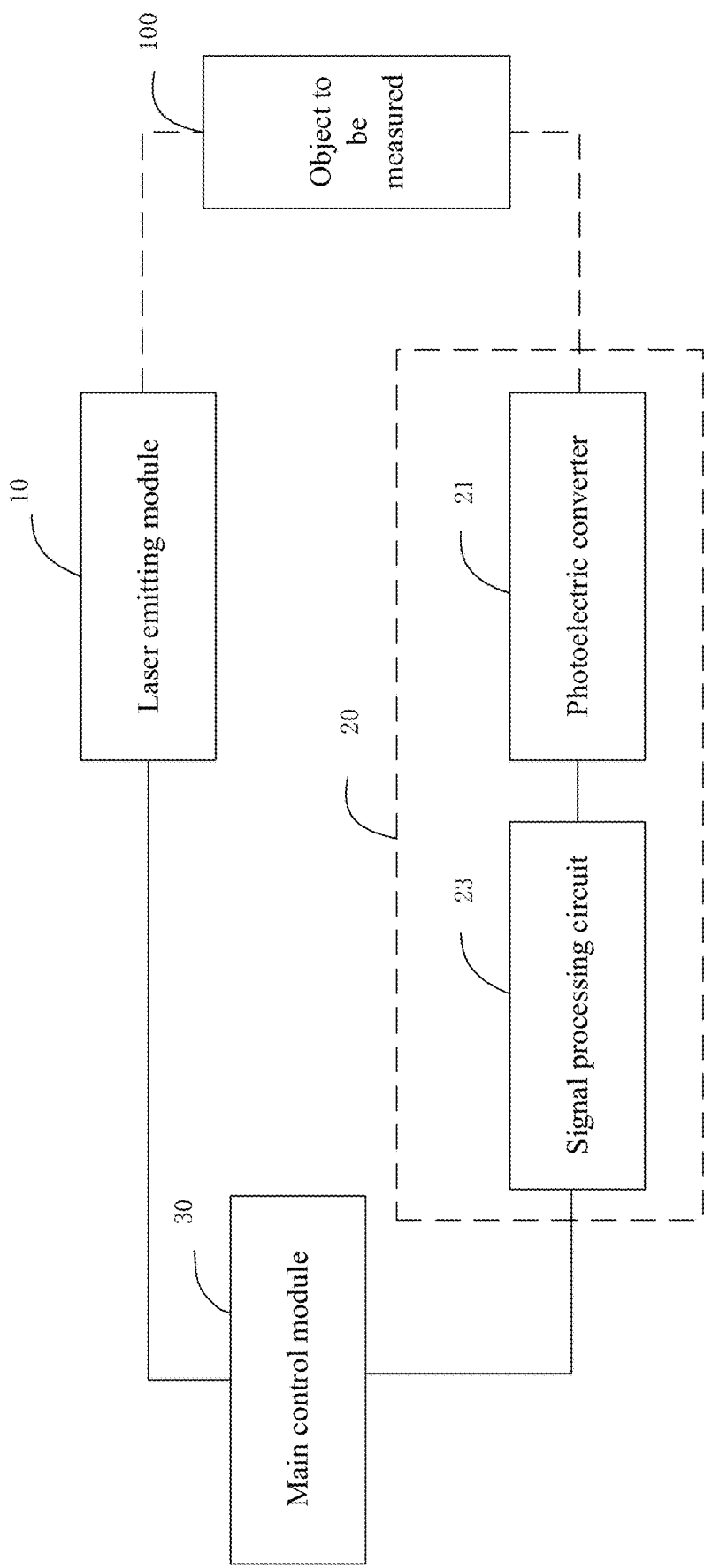
FIG. 9 is a schematic diagram of a LiDAR apparatus according to an embodiment of the present disclosure.

As shown in FIG. 9, the present disclosure also provides a LiDAR apparatus, including a laser receiving module 20, a main control module 30, and a laser emitting module 101. A specific structure of the laser emitting module 101 refers to the forgoing embodiments. Since the LiDAR apparatus adopts all the technical solutions of the forgoing embodiments, the LiDAR apparatus has at least all the benefits brought by the technical solutions of the forgoing embodiments, which is not repeated here. The main control module 30 is connected to the laser receiving module 20 and the laser emitting module 101 respectively.

The laser receiving module 20 and the laser emitting module 101 are arranged correspondingly.

The laser receiving module 20 is configured to receive the plurality of reflected laser pulses and convert the reflected laser pulses into a plurality of corresponding echo signals.

The main control module is configured to output a drive control signal to drive the laser emitting module to emit laser pulses according to a preset timing sequence and determine distance information of an object to be measured according to corresponding echo signals.

In the embodiment, the laser emitting module 101 is arranged correspondingly with the laser receiving module 20. The laser emitting module 101 triggers and outputs a plurality of laser pulses to an object 100 to be measured according to the a drive control signal. The laser receiving module 20 receives the reflected laser pulses and converts the reflected laser pulses into corresponding echo signals. The main control module 30 determines distance information of an object 100 to be measured according to emitting time and receiving time of the laser pulses.

The laser receiving module 20 includes a corresponding photoelectric converter 21 and a signal processing circuit 23. The photoelectric converter 21 converts the received laser pulses into current signals. The signal processing circuit 23 converts the current signals into voltage signals, amplifies the voltage signals, and converts analog-to-digital sampling signals to output the corresponding echo signals to the main control module 30. The main control module 30 uses a corresponding controller or processor to complete drive control of the laser emitting module 101 and the laser receiving module 20 and confirm distance information.

Corresponding to arrangement of the lasers 111 of the laser emitting module 101, in some embodiments, as shown in FIG. 8, the laser receiving module 20 includes a receiving board 22.

There are a plurality of photoelectric converters 21 corresponding to the plurality of lasers 111 on the receiving board 22. The plurality of photoelectric converters 21 are arranged into an array, and are arranged correspondingly with a plurality of lasers 111 one-to-one or multiple-to-one. Each of the photoelectric converters 21 receives the corresponding laser pulses and photoelectrically converts the corresponding laser pulses into corresponding current signals. The current signals are converted into the corresponding echo signals via the signal processing circuit 23 of the laser receiving module 20.

Correspondingly, the signal processing circuit 23 can be arranged on the receiving board 22 or separately from the photoelectric converters 21. The main control module 30 is connected to the corresponding receiving board 22 or other carrier plate via a signal wire, and receives the echo signals returned from the signal processing circuit 23.

Corresponding to different scanning fields of view, the LiDAR apparatus can also include a corresponding rotating device, such as a motor and a corresponding rotating platform. The laser emitting board and the receiving board are arranged on the corresponding rotating platform. The motor rotates horizontally with the rotating platform to form a horizontal region of the field of view. A vertical region Y of the field of view is formed according to accumulation of channel numbers in a vertical direction. Horizontal direction information and vertical direction information are combined to form a 3D point cloud image.

A LiDAR emits a detecting laser beam to a target object via the laser emitting device, then compares the received reflected signals from the target object with emitted signals, and obtains relevant information of the target object after processing. According to the number of laser beams, there usually are single-beam LiDAR, 4-beam LiDAR, 8/16/32/64-beam LiDAR, and so on. One or more laser beams are emitted at different angles in the vertical direction and scanned in a horizontal direction to detect a 3D contour of a target region. A plurality of measuring channels (beams) are equivalent to scanning planes with a plurality of inclined angles. Therefore, the more the laser beams in a vertical field of view, the higher angle resolution in the vertical direction, and the greater a density of a laser point cloud. In actual use, the inventors of the present disclosure discovered that, at present, for a multi-beam LiDAR, due to limitation of a volume of a laser emitting board and arrangement of laser emitting units on the laser emitting device, a PCB space of the laser emitting board in a multi-beam concurrent laser emitting device cannot be effectively utilized with a low space utilization rate and a large volume, thus reducing the angle resolution of the LiDAR.

Based on this, the present disclosure provides a laser emitting device to improve a space utilization rate of the laser emitting device, reduce a volume, simplify a structure and further improve resolution.

As shown in FIG. 10, an embodiment of the present disclosure provides a laser emitting device, including at least one laser emitting board 1000 and at least one optical fiber 2000. A first surface and a second surface of the laser emitting board 1000 are provided with a plurality of laser emitting units respectively. The plurality of laser emitting units are arranged side by side along an upper edge of the laser emitting board 1000. The first surface is located on an opposite side of the second surface, that is, a back surface. The optical fiber 2000 is arranged on a cross section of the upper edge of the laser emitting board 1000 and configured to focus optical paths of the plurality of laser emitting units.

Specifically, the laser emitting board 1000 is a PCB plate. The PCB plate has a front first surface and a back second surface. FIG. 10 shows an arrangement of the plurality of laser emitting units on the first surface. The first surface includes a plurality of laser emitting units: a first laser emitting unit 1100, a second laser emitting unit 1200, . . . , an $n^{th}$ laser emitting unit 1$n$00. The plurality of laser emitting units on the laser emitting board 1000 are distributed on the first surface and the second surface of the PCB plate respectively. As shown in FIG. 10, the plurality of laser emitting units are arranged side by side in an X-axis direction along the upper edges of the first surface and the second surface of the PCB plate. Light emitting directions of the plurality of laser emitting units are the same (both are parallel to a Y-axis direction or have a certain included angle with the Y-axis direction). The laser emitting units are arranged on both surfaces, which can effectively improve a space utilization rate of the laser emitting device. In one embodiment of the present disclosure, the plurality of laser emitting units located on the first surface and the second surface share one optical fiber 2000 and work in an alternate light emitting manner. The optical fiber 2000 is in a shape of a long strip. The optical fiber 2000 is fixed on the cross section of the upper edge of the laser emitting board 1000 through glue dispensing, and covers lasers emitted by all the laser emitting units on one laser emitting board 1000. With this arrangement, engineering difficulty can be greatly reduced. In another embodiment of the present disclosure, the laser emitting board 1000 is provided with two optical fibers. The plurality of laser emitting units on the first surface share one optical fiber, and the plurality of laser emitting units on the second surface share another optical fiber. In such a way, the laser emitting units on the first surface and the second surface can work concurrently at the same time.

Each of the laser emitting units includes a modular circuit. The modular circuit is arranged to effectively guarantee consistent electrical performance of each of the laser emitting units. Taking the first laser emitting unit 1100 as an example, the modular circuit includes a light emitting source 1100$a$, a driver 1100$b$, and a variable voltage source 1100$c$. A light outlet of the light emitting source 1100$a$ is arranged on the upper edge of the laser emitting board 1000, and can be aligned with or slightly lower or slightly higher than the upper edge. The driver 1100$b$ and the variable voltage source 1100$c$ are arranged on the laser emitting board 1000. The variable voltage source 1100$c$ is configured to output voltage signals according to control signals. The driver 1100$b$ is configured to generate drive signals according to the voltage signals. The light emitting source 1100$a$ is configured to emit a laser according to the drive signals. The light emitting source can be a laser. The laser outputted by the light emitting source 1100$a$ is focused on the optical fiber 2000. The focused laser is emitted via the optical fiber 2000. In the embodiment of the present disclosure, the laser emitting device further includes a control unit. The control unit can be arranged on each of the laser emitting boards 1000 or can work independently from the laser emitting board 1000. The plurality of laser emitting units on the laser emitting board can be controlled by one control unit. The control unit is connected to the variable voltage source of the laser emitting unit via a flexible flat cable or a coaxial wire, and configured to send control signals to the variable voltage source of the laser emitting unit, thereby controlling the voltage signals of the variable voltage source. A working process of the plurality of laser emitting units on the laser emitting board 1000 is as follows. The control unit sends the control signals to the variable voltage source of each of the laser emitting units via the flexible flat cable or the coaxial wire. The variable voltage source (charging, and adjusting laser emitting energy of the laser via the voltage signals) generates the corresponding voltage signals according to the control signals and sends the voltage signals to the driver. The driver generates drive signals according to the voltage signals so as to drive the outgoing light source to emit a laser. The laser emitted by the outgoing light source is focused via the optical fiber 2000. The focused laser is emitted via the optical fiber 2000. For the same laser emitting board 1000, the laser emitting unit on the first surface and the laser emitting unit on the second surface can work alternately. The control unit generates the control signals according to a preset control logic, thereby controlling each of the laser emitting units on the laser emitting board 1000 to work alternately or concurrently.

In other embodiments of the present disclosure, the variable voltage source includes an emitting circuit. As shown in FIG. 1, each group of emitting circuits 10 includes one charging energy storage circuit 110 and at least one potential energy circuit 120. The charging energy storage circuit 110 is triggered to charge and work at intervals by charging signals emitted by the corresponding control units.

It can be understood that, when a group of laser emitting circuits 10 include a plurality of potential energy circuits 120, the plurality of potential energy circuits 120 can be located on the same emitting board or different laser emitting boards 1. It can be understood that, with demand for high resolution, the number and density of the lasers increase correspondingly. When the laser is connected to a corresponding drive circuit in a one-to-one manner, the number of charging and discharging circuits increases synchronously, thereby causing a circuit configuration to become more complex. For the complex circuit configuration, costs and wiring difficulty of a laser emitting module increase at the same time, which limits development of high resolution of the laser emitting module. In an embodiment of the present disclosure, at least two groups of laser emitting circuits are arranged so that each group of laser emitting circuits includes one charging energy storage circuit and at least one energy releasing circuit. The energy releasing circuit includes an energy releasing switch and at least one laser. The energy releasing switch is turned on to drive a laser group to work correspondingly. The charging energy storage circuit and the energy releasing circuit are arranged one-to-one or one-to-multiple. High vertical resolution is realized, a circuit configuration of the laser emitting module is further simplified, and design costs are reduced. In addition, any two adjacent emissions correspond to different groups of laser emitting circuits, and therefore, heat dissipation of the same laser emitting circuit is improved, thereby reducing heat accumulation and improving channel consistency.

It can be understood that, as an embodiment of the present disclosure, when a LiDAR includes a plurality of emitting boards, each of the laser emitting boards can correspond to a group of laser emitting circuits. Any two adjacent emissions correspond to different groups of laser emitting circuits. That is, two adjacent emissions correspond to the lasers on different emitting boards. Different laser emitting boards corresponding to any adjacent two emissions are controlled, which can improve the heat dissipation of the same laser emitting circuit, reduce the heat accumulation on the emitting boards at the same time, and thus improve the channel consistency.

Further, for the present disclosure, the modular circuit is arranged so that electrical performance of each of the laser emitting circuits is effectively guaranteed to be consistent. In addition, the emitting circuit in the module circuit is arranged, which can further simplify a circuit configuration. In addition, different laser emitting circuits corresponding to any adjacent two emissions are controlled, which can improve the heat dissipation of the same laser emitting circuit, reduce the heat accumulation on the emitting boards at the same time, and thus improve the channel consistency.

The laser emitting board 1000 is also provided with a positioning hole for positioning each of the laser emitting units on the first surface and the second surface of the laser emitting board 1000, so as to control accuracy of coordinates of each of the laser emitting units on front and back surfaces on the PCB plate. Specifically, the positioning hole can be a metal ring through-hole at the same Y axis on upper and lower ends of the first surface and the second surface of the PCB plate. There is one or more metal ring through-holes.

In the embodiment of the present disclosure, angles of respective laser emitting units on the same laser emitting board 1000 can be the same or different. An angle of a laser emitting unit is determined according to an emitting angle of a field of view of the laser emitting device. The number of the laser emitting units is determined according to a frame rate designed by the laser emitting device. When the angle of the field of view required by design is relatively large, the angles of the respective laser emitting units can be different, thus increasing the angle of the field of view. When equal spacing angles are needed by the design, the angles of the respective laser emitting units are consistent, thereby improving resolution of the LiDAR. It can be understood that as an embodiment, the emitting units on the emitting board can also be densely arranged according to design requirements of different detection fields of view. For example, the emitting units are arranged more densely in the target detection field of view, and the emitting units are arranged more sparsely in the general detection field of view. That is, an arrangement interval of the emitting units in the target detection field of view is smaller than that in the general detection field of view.

A material of the laser emitting board 1000 can be a plate with a high TG value (TG refers to a vitrification temperature, which is a vitrification temperature of the plate heated under a high temperature) and a high hardness, thus ensuring relatively small PCB warpage and relatively excellent surface flatness. Further, a PCB design of the laser emitting board in the embodiment of the present disclosure adopts a blind burying hole mode, so that via holes of a dense device region with the first surface and the second surface do not interfere with each other.

The laser emitting device of the embodiment of the present disclosure includes at least one laser emitting board and at least one optical fiber. The plurality of laser emitting units are provided on the first surface and the second surface of the laser emitting board respectively. The plurality of laser emitting units are arranged side by side along the upper edge of the laser emitting board. The first surface is located on an opposite side of the second surface. The optical fiber is arranged on the cross section of the upper edge of the laser emitting board and configured to focus the optical paths of the plurality of laser emitting units. With this arrangement, a volume of the whole laser emitting device can be effectively reduced, thereby improving a space utilization rate. Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty. Further, the modular circuit is arranged so that an electrical performance of each of the laser emitting units is effectively guaranteed to be consistent. Further, by modularizing the laser emitting board, an angle of each of the laser emitting units on the laser emitting board can be adjusted only by adding the laser emitting board when a channel needs to be expanded, thus simplifying a structure of the laser emitting device.

An embodiment of the present disclosure provides a laser emitting device. The embodiment of the present disclosure is distinct from the forgoing embodiment in that the embodiment of the present disclosure is provided with a plurality of laser emitting boards. Each of the laser emitting boards corresponds to an optical fiber. It can be understood that the number of the plurality of emitting boards can be two, three, four or five, etc. It can be understood that the number of the plurality of emitting boards can be an integer greater than or equal to 2. The number of emitting boards is not uniquely limited herein. FIG. 11 shows a side view of the plurality of laser emitting boards. As can be seen from FIG. 2, a plurality of laser emitting units are provided on the first surface and the second surface (left and right sides as shown in the figure) of each of the laser emitting boards. A structure of each of the laser emitting boards is the same as that of the forgoing embodiments, which is not repeated herein.

In the embodiment of the present disclosure, the plurality of laser emitting boards are arranged in parallel. A second surface of an $n^{th}$ emitting board and a first surface of an $n+1^{th}$ emitting board are arranged oppositely, where n is an integer greater than or equal to 1. The respective laser emitting boards can be parallel or have a certain angle. The plurality of laser emitting units on each of the laser emitting boards emit laser beams in parallel. With a preset control logic of the control unit, each of the laser emitting units can be sequentially encoded, thereby realizing laser emitting control of each of the laser emitting units. A laser emitting sequence can be controlled by timing sequence coding, thereby reducing interference between the plurality of laser emitting units on each of the laser emitting boards and improving detection accuracy. A spacing between the laser emitting boards matches an optical lens and an optical path structure. The minimum spacing between the laser emitting boards needs to meet requirement of non-interference of lasers between the plurality of laser emitting units. In the embodiment of the present disclosure, the minimum spacing between the lasers can be calculated according to a size of the light emitting source and a size of binding the laser emitting board. A width of the light emitting board is related to a density of a light spot, an optical isolation degree of the laser emitting units and an optical angle arrangement of the emitting units.

In the laser emitting device of the embodiment of the present disclosure, wiring of each of the laser emitting boards and the laser emitting unit on the laser emitting board is basically consistent. The laser emitting units all include the same modular circuit, thereby ensuring that layout wiring of each of the outgoing light sources is basically consistent.

In one embodiment of the present disclosure, the laser emitting device includes four laser emitting boards. 16 laser emitting units are arranged on the first face and the second face of each of the laser emitting boards respectively, so that 32 lasers are formed on one laser emitting board. The plurality of laser emitting boards work in multi-beam concurrent mode. 32 laser emitting units on each of the laser emitting boards work in series to form a 128-beam LiDAR. the laser emitting sequence is controlled by a logic. This mode can save a more structural space on the premise of ensuring a better laser emitting power and convenient focusing. The number, coordinate positions and angles of the laser emitting units of each of the laser emitting boards can be determined according to design needs. When angle requirements are different, each of the laser emitting boards only needs to adjust an angle position of the laser emitting unit independently, which reduces a workload of product development, and can make each laser emitter form modularization to ensure performance consistency of each of the lasers.

The laser emitting device of the embodiment of the present disclosure includes at least one laser emitting board and at least one optical fiber via the laser. A plurality of laser emitting units are arranged on the first surface and the second surface of the laser emitting board respectively. The plurality of laser emitting units are arranged side by side along the upper edge of the laser emitting board. The first surface is located on an opposite side of the second surface. An optical fiber is arranged on the cross section of the upper edge of the laser emitting board and configured to focus the optical paths of the plurality of laser emitting units. With this arrangement, a volume of the whole laser emitting device can be effectively reduced, thereby improving a space utilization rate. Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty. Further, the modular circuit is arranged so that an electrical performance of each of the laser emitting units is effectively guaranteed to be consistent. Further, by modularizing the laser emitting board, an angle of each of the laser emitting units on the laser emitting board can be adjusted only by adding the laser emitting board when a channel needs to be expanded, thus simplifying a structure of the laser emitting device.

The embodiment of the present disclosure provides a laser emitting device. A structure of the embodiment of the present disclosure is generally identical with that of the laser emitting device. Details are not described herein again. The difference is that the laser emitting units in the same row on the first surface and the second surface of the laser emitting board of the embodiment of the present disclosure are arranged in a staggered manner along a vertical field of view; and/or the laser emitting units in the same row between the respective laser emitting boards are arranged in a staggered manner along the vertical field of view. That is, the plurality of laser emitting units on two adjacent laser emitting boards are arranged in a staggered manner. The plurality of laser emitting units on the first surface or the second surface arranged oppositely between two adjacent laser emitting boards are arranged in a staggered manner.

Figure 12:
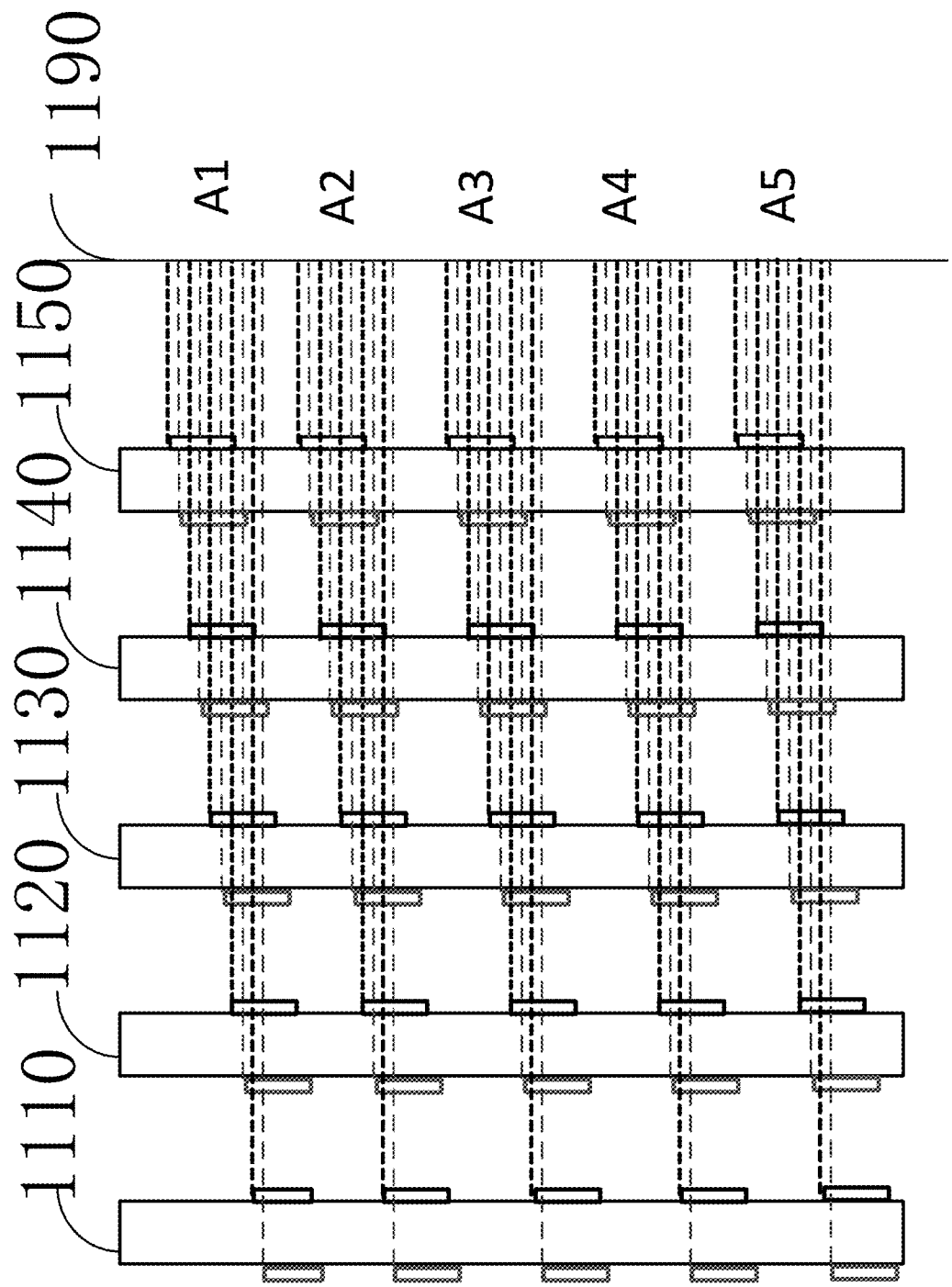
FIG. 12 is a schematic structural diagram of a laser emitting device according to another embodiment of the present disclosure.

FIG. 12 shows a structural schematic diagram of a laser emitting device according to another embodiment of the present disclosure. As shown in FIG. 12, each of the laser emitting boards is sequentially provided with five rows of the laser emitting units along the vertical field of view, namely, A1, A2, A3, A4 and A5 respectively. The laser emitting board is provided with a laser emitting unit on the first surface and the second surface of each row respectively. The laser emitting units on the first surface and the second surface of each row are arranged in a staggered manner in the vertical field of view, so that there are staggered vertical angles of the field of view between the laser emitting units on the first surface and the second surface of each row. The laser emitting units corresponding to each row of each of the laser emitting boards are also arranged in a staggered manner. There is a certain vertical angle of field of view. Therefore, vertical resolution can be adjusted by staggered vertical angles of the field of view. Specifically, for example, for the laser emitting board 1150, and in a row A1, there is one preset positional difference in the vertical field of view for the laser emission between the first surface and the second surface. There is also one preset positional difference in rows A2 through A5 respectively. There is also one preset positional difference between the laser emitting boards 1110 to 1150 in each row. In one embodiment of the present disclosure, the vertical angle of field of view staggered by the laser emitting units in the same row of the laser emitting board is 0.4 degrees. The vertical resolution of the whole laser emitting device is 0.1 degrees. 1190 is a calibration line of a position difference set by each of the laser emitting units in the vertical field of view. It can be seen that with such setting, outgoing laser beams emitted by each laser emitting unit are staggered, which is equivalent to increasing the per-unit-length number of outgoing laser beams in the vertical direction, thus increasing vertical resolution of the multi-beam LiDAR.

The embodiment of the present disclosure provides a laser emitting device. A structure of the embodiment of the present disclosure is generally identical with that of the laser emitting devices described above. Details are not described herein again. The difference is that the plurality of laser emitting boards are arranged at a preset angle so that outgoing laser beams of different laser emitting boards are at a preset angle. Referring to FIG. 10 and FIG. 13, in the embodiment of the present disclosure, a Y axis is parallel to a direction of a laser emitted from each of the laser emitting boards. A Y axis of each of the laser emitting boards is arranged at a preset angle, so that the outgoing laser beams of different laser emitting boards are at the preset angle. As shown in FIG. 13, an included angle between the laser emitting board 1110 and the laser emitting board 1120 is α1. An included angle between the laser emitting board 1120 and the laser emitting board 1130 is α2. An included angle between the laser emitting board 1130 and the laser emitting board 1140 is α3. An included angle between the laser emitting board 1140 and the laser emitting board 1150 is α4. This arrangement ensures a higher integration level of the laser emitting device.

Figure 14:
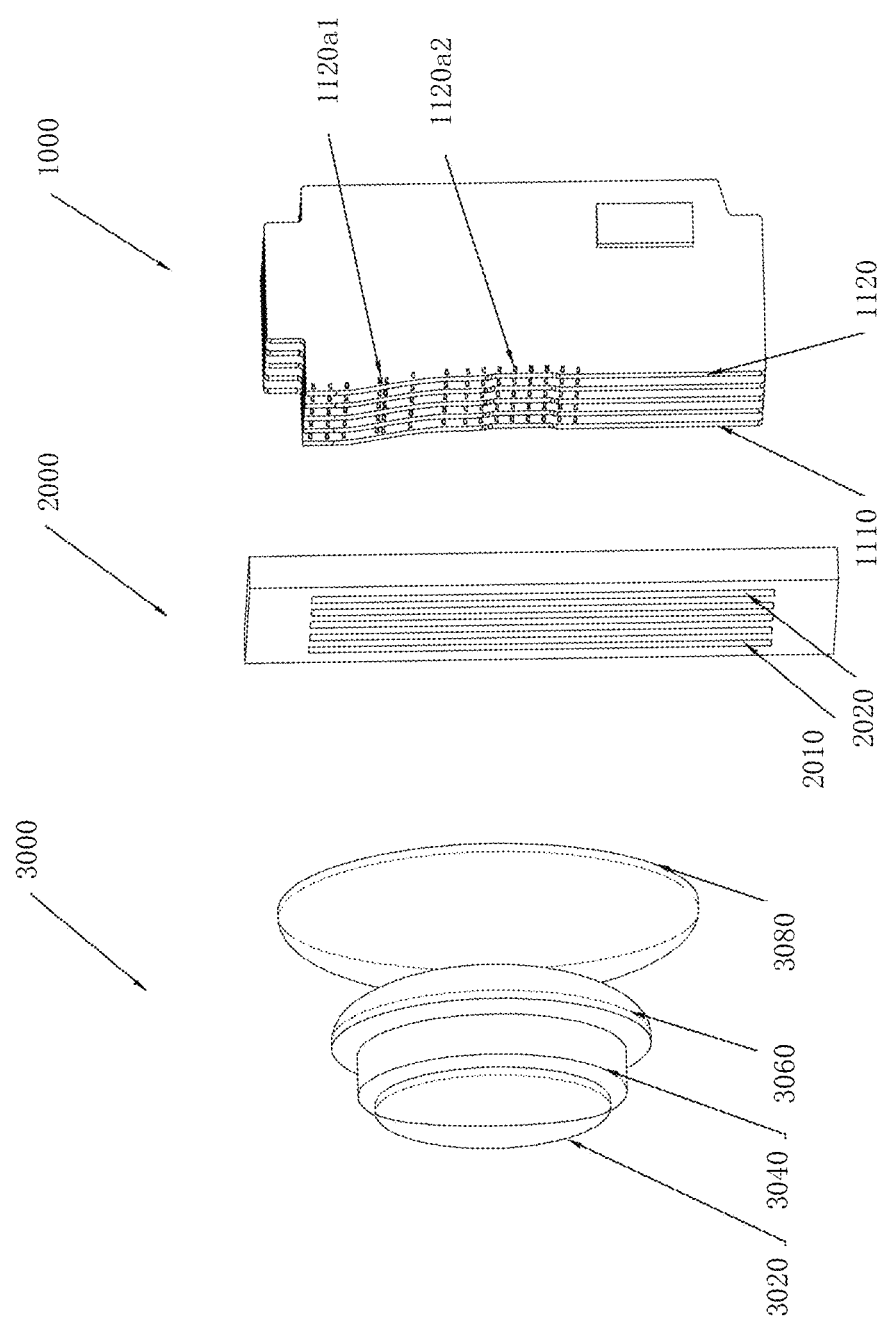
FIG. 14 is a schematic structural diagram of a laser emitting device according to another embodiment of the present disclosure.

The embodiment of the present disclosure provides a laser emitting device. A structure of the embodiment of the present disclosure is generally identical with that of the laser emitting devices described above. Details are not described herein again. The difference is that as shown in FIG. 14, the laser emitting apparatus of the embodiment of the present disclosure includes a laser emitting lens group 3000 in addition to a laser emitting array 1000 including a plurality of laser emitting boards (such as a laser emitting board 1110 and a laser emitting board 1120). A plurality of laser emitting units are arranged at positions of an actual focal plane of the laser emitting lens group 3000. For example, the plurality of laser emitting units (such as 1120a1 and 1120a2) on the laser emitting board 1120 are irregularly arranged along a vertical direction of a main optical axis of a laser emitting lens group, so that a light spot formed after the laser emitted from each of the laser emitting units passes through the laser emitting lens group meets a preset size requirement. In the embodiment of the present disclosure, light outlets of the plurality of laser emitting units are arranged at the actual focal plane. The preset size requirement of the light spot is determined by a person skilled in the art according to the emission field angle of the laser emitting lens group 3000 set in a specific scene, which is not specifically limited in the embodiment of the present disclosure.

An objective is as follows. Ideally, the focal plane of the laser emitting lens is one plane. However, due to the limitation of features of the laser emitting lens group, an actual focal plane at an edge position of the laser emitting lens group is often ahead of the focal plane at the center position, which makes the actual focal plane of the laser emitting lens group not one plane, but one curved surface or one arc surface. In practical use, if all the laser emitting units are arranged in a straight wire relative to the laser emitting lens, respective aberrations are large when a vertical field of view is large, so that each of the emitting devices cannot be at the best focus position, and an outgoing light spot of each of the emitting devices cannot reach the best state. Therefore, in view of the aberration of the laser emitting lens, for the embodiments of the present disclosure, a position of each of the laser emitting units on the laser emitting board is set according to a position of the actual focal plane of each part of the laser emitting lens group. An irregular arrangement is used. When the actual focal plane of the laser emitting lens group 3000 is determined, optical features of each of a first lens 3020, a second lens 3040, a third lens 3060, and a fourth lens 3080 are comprehensively considered. Then fitting is performed to determine the actual focal plane of the laser emitting lens group 3000. The laser emitting unit is sparsely arranged on the laser emitting board at a position corresponding to a region where the emitting angle of field of view of the laser emitting lens group is greater than or equal to a second preset threshold. Laser emitting units are densely arranged on the laser emitting board at a position corresponding to a region where the emitting angle of the field of view of the laser emitting lens group is smaller than the second preset threshold. On each of the laser emitting boards, the plurality of laser emitting units are arranged in an arc shape along a direction perpendicular to a main optical axis of the laser emitting lens group. In this way, production and manufacture of the laser emitting board are facilitated. Further, while considering the vertical field of view of the laser emitting lens group, aberration of the laser emitting lens group in the horizontal field of view is also considered. When each laser emitting board is arranged in the embodiment of the application, in addition to making the laser emitting units on each of the laser emitting boards arc-shaped or irregularly arranged, the arrangement of each of the laser emitting boards is also generally coordinated. Therefore, a plurality of laser emitting units on all the laser emitting boards form a concave arrangement relative to the laser emitting lens, so that all the laser emitting units are located in the actual focal plane of the laser emitting lens group 3000 to the greatest extent. That is, due to the limitation of the laser emitting lens group 3000, the actual focal plane of the laser emitting lens group 3000 is one concave curved surface. Therefore, each of the laser emitting units on all the respective laser emitting boards is arranged on the concave curved surface. The laser emitting units are irregularly arranged at a focal plane position of the laser emitting lens group, so that the laser emitting unit is located at the optimal focus position at the laser emitting lens group after comprehensive consideration of the aberration. An emitted light spot reaches the optimal state. Problems of dragging points and high anti-expansion on a point cloud are reduced.

Figure 15:
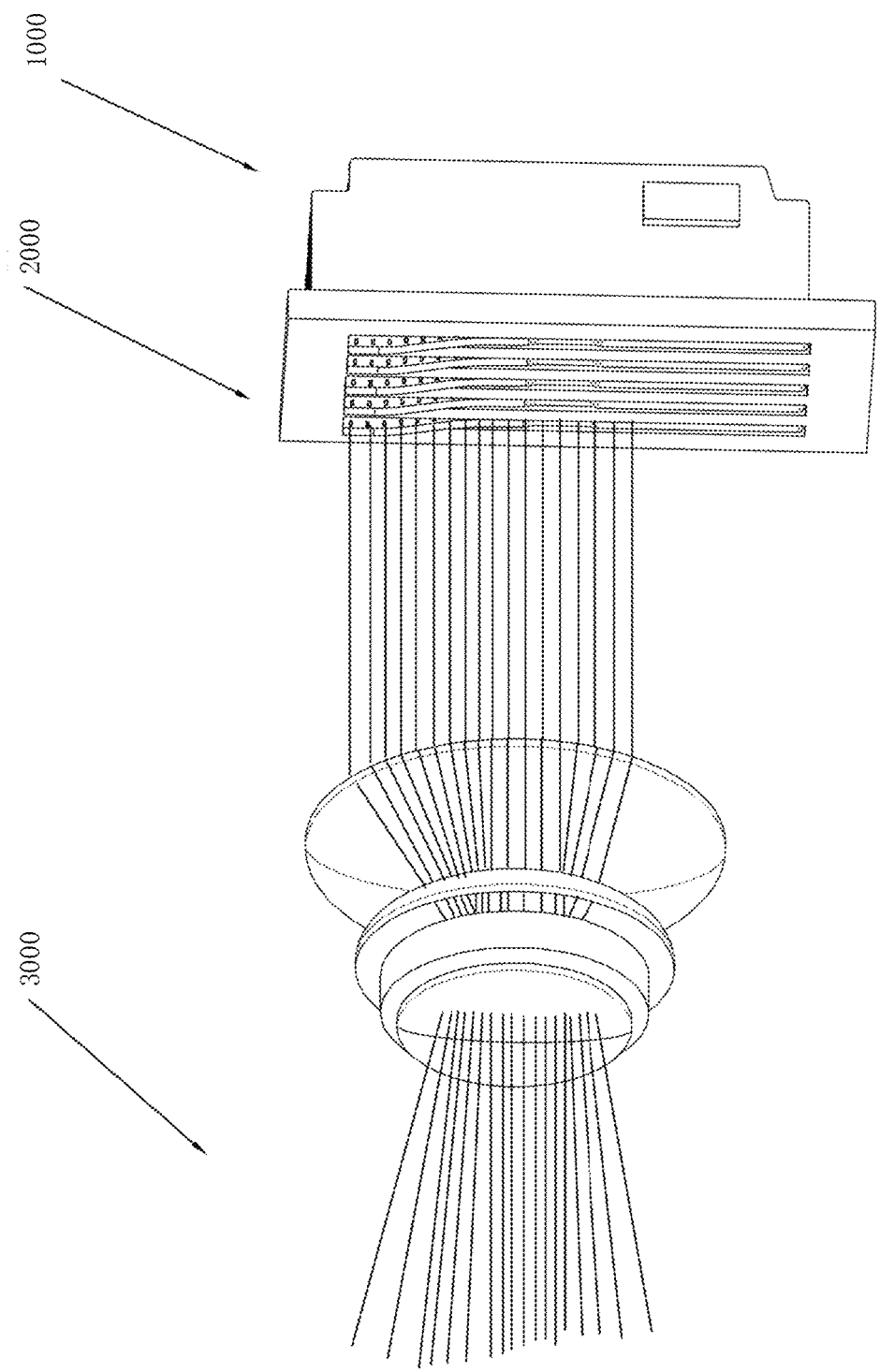
FIG. 15 is a schematic structural diagram of a laser emitting device according to another embodiment of the present disclosure.

Further, in order to improve a laser emitting effect of the laser emitting device, the laser emitting device further adds an emitting grating 2000 on the basis of the forgoing embodiments. As shown in FIG. 14 and FIG. 15, the emission grating 2000 is arranged between the laser emission array 1000 and the laser emission lens group 3000. When in use, the emitting grating 2000 is arranged near one end of the laser emission array 1000 to isolate the respective laser emitting units. The emitting grating 2000 is arranged, which can effectively reduce the outgoing light spot of the laser emitting unit. Specifically, through-holes are arranged at a position corresponding to the laser emitting board on the emitting grating 2000, such as through-holes 2010 and 2020 shown in the figure. Light blocking strips are arranged between the through-holes. The arrangement of the through-holes needs match with the laser emitting units. One through-hole can be used for each of the emitting units, or one through-hole is used for a plurality of the emitting units. Alternatively, column-division or row-division can be adopted. When the plurality of laser emitting units correspond to one through-hole, a spacer strip can be arranged in the position between the through-hole and each of the laser emitting units on the laser emitting board to isolate the laser emitting unit in the same through-hole. The emitting grating 2000 is configured to block a position with a low energy density of the light spot, reduce a size of an outgoing light spot, and reduce the problems such as dragging points and high anti-expansion on a point cloud. Referring to FIG. 15, it can be seen that the plurality of laser emitting units are irregularly arranged on each of the laser emitting boards in the laser emitting array 1000. The laser emitting units are irregularly arranged according to a position of the focal plane of the laser emitting lens group. The outgoing laser beam passes through a barrier of a laser grating, thereby forming a relatively small light spot and having a better emitting effect. The outgoing laser beam is directly emitted on the laser emitting lens group. After being adjusted by the laser emitting lens group, the outgoing laser beam is directed at a scanned object, so that an outgoing light spot of the laser emitting unit reaches the optimal state, thereby reducing the problems such as the dragging points and the high anti-expansion on the point cloud.

Figure 16:
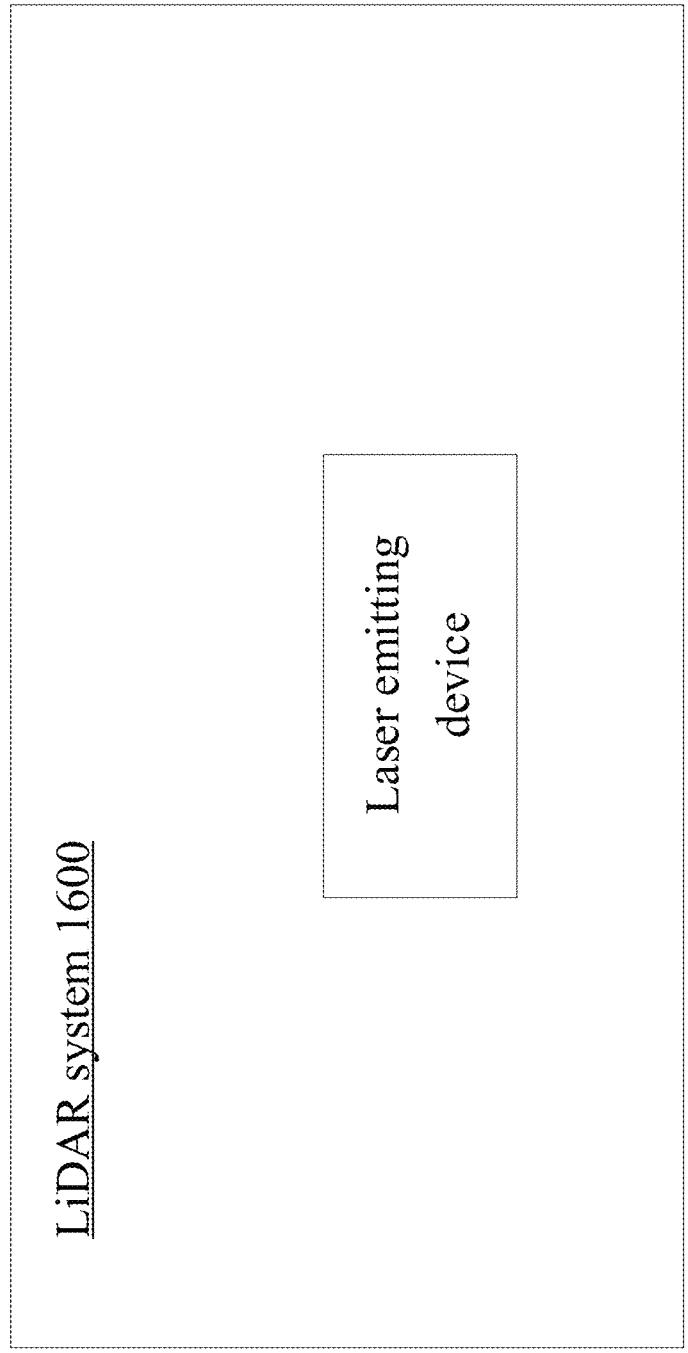
FIG. 16 is a schematic diagram of a LiDAR system according to an embodiment of the present disclosure.

As shown in FIG. 16, an embodiment of the present disclosure provides a LiDAR system 1600, including the laser emitting device of the forgoing embodiments. A specific structure of the laser emitting device in the LiDAR system 1600 is substantially identical to that of the laser emitting devices of the forgoing embodiments, which is not repeated here.

The laser emitting device of the embodiment of the present disclosure includes at least one laser emitting board and at least one optical fiber via the laser. A plurality of laser emitting units are arranged on a first surface and a second surface of the laser emitting board respectively. The plurality of laser emitting units are arranged side by side along an upper edge of the laser emitting board. The first surface is located on an opposite side of the second surface. An optical fiber is arranged on a cross section of the upper edge of the laser emitting board and configured to focus optical paths of the plurality of laser emitting units. With this arrangement, a volume of the whole laser emitting device can be effectively reduced, thereby improving a space utilization rate. Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty. Further, a modular circuit is arranged so that an electrical performance of each of the laser emitting units is effectively guaranteed to be consistent. Further, by modularizing the laser emitting board, an angle of each of the laser emitting units on the laser emitting board can be adjusted only by adding the laser emitting board when a channel needs to be expanded, thus simplifying a structure of the laser emitting device.

An embodiment of the present disclosure provides an intelligent apparatus, including the LiDAR system in any one of the forgoing embodiments. The intelligent apparatus can be an autonomous driving apparatus, an intelligent robot navigation apparatus, an unmanned aerial vehicle and the like, which is not specifically limited in the embodiments of the present disclosure. A specific structure of the LiDAR system in the intelligent apparatus is substantially identical to the structure of the forgoing LiDAR system embodiments, which is not repeated here.

The laser emitting device of the embodiment of the present disclosure includes at least one laser emitting board and at least one optical fiber via the laser. A plurality of laser emitting units are arranged on a first surface and a second surface of the laser emitting board respectively. The plurality of laser emitting units are arranged side by side along an upper edge of the laser emitting board. The first surface is located on an opposite side of the second surface. An optical fiber is arranged on a cross section of the upper edge of the laser emitting board and configured to focus optical paths of the plurality of laser emitting units. With this arrangement, a volume of the whole laser emitting device can be effectively reduced, thereby improving a space utilization rate. Further, the optical fiber is fixed on the cross section of the upper edge of the laser emitting board through glue dispensing so that the plurality of laser emitting units on front and back surfaces of one laser emitting board are focused via the optical fiber, thereby enhancing reusability of the optical fiber and effectively reducing engineering difficulty. Further, a modular circuit is arranged so that an electrical performance of each of the laser emitting units is effectively guaranteed to be consistent. Further, by modularizing the laser emitting board, an angle of each of the laser emitting units on the laser emitting board can be adjusted only by adding the laser emitting board when a channel needs to be expanded, thus simplifying a structure of the laser emitting device.

It is understood that in order to streamline the present disclosure and help understand one or more of the various inventive aspects, in the forgoing description of the exemplary embodiments of the present disclosure, various features of the embodiments of the present disclosure are sometimes grouped together into a single implementation, example, diagram, or description. However, the disclosed method should not be interpreted as reflecting the intention that the claimed invention requires more features than those explicitly stated in each claim.

The person skilled in the art can understand that it is possible to adaptively change the modules in an apparatus in the embodiments. The modules can be arranged in one or more devices different from the embodiments. The modules, units, or assemblies in the embodiments can be combined into one module, unit, or assembly. The modules, units, or assemblies can be divided into a plurality of sub-modules, sub-units, or sub-assemblies. Unless expressly stated otherwise, each feature disclosed in this specification (including the accompanying claims, abstract and drawings) can be replaced by an alternative feature providing the same, equivalent, or similar objective or result.

It is noted that the forgoing embodiments illustrate rather than limit the present disclosure, and a person skilled in the art can design alternative embodiments without departing from the scope of the appended claims. In the claims, any reference signs positioned between parentheses should not be constructed as a limitation to the claims. The word "including" does not exclude the presence of elements or steps not listed in the claims. The word "a" or "an" preceding an element does not exclude the presence of a plurality of such elements. The present disclosure can be implemented by means of hardware including a plurality of different elements and by means of a suitably programmed computer. In the unit claims enumerating a plurality of devices, the plurality of devices can be embodied in the same hardware item. Unless otherwise specified, the steps in the foregoing embodiments should not be understood as a limitation on an execution order.

The above embodiments are intended for describing instead of limiting the technical solutions of the present disclosure. Although the present disclosure is described in detail with reference to the above embodiments, a person skilled in the art should understand that they may still make modifications to the technical solutions described in the above embodiments or make equivalent replacements to some technical features thereof. And these modifications or replacements do not make the essence of the corresponding technical solutions depart from the spirit and scope of the technical solutions of the embodiments of the present disclosure, and should be included in the scope of protection of the present disclosure.

What is claimed is:

1. A laser emitting module, comprising at least two groups of laser emitting circuits, wherein each group of the laser emitting circuits comprises one charging energy storage circuit and a plurality of energy releasing circuits, at least two of the plurality of energy releasing circuits each includes a plurality of lasers and a plurality of energy releasing switches, the plurality of energy releasing switches and the plurality of lasers are connected in parallel in one-to-one correspondence, and the charging energy storage circuit is triggered at intervals to charge and work by a corresponding charging signal; any one of the plurality of energy releasing circuits comprises an energy releasing switch and at least one laser connected in series, and the energy releasing circuits are triggered to connect by a corresponding discharge signal, to drive the at least one laser in the energy releasing circuits to emit a laser pulse toward a corresponding field of view; and when the laser emitting module continuously emits laser pulses, two adjacent laser pulses are triggered to be emitted by different groups of the laser emitting circuits;

at least one laser emitting board, wherein when a group of the laser emitting circuits comprises multiple energy releasing circuits, the multiple energy releasing circuits being located on the same laser emitting board or different laser emitting boards;

lasers are arranged on the laser emitting board corresponding to staggered optical emitting angles, wherein the at least one laser emitting board comprises a first side surface and a second side surface that are arranged oppositely; and for each of the at least one laser emitting board, a binding region is arranged in at least one of an edge region of the first side surface and a same edge region of the second side surface, and the plurality of lasers are sequentially bound at intervals to the binding region along a vertical region corresponding to a field of view;

a fixing bracket configured to fix and install a plurality of the laser emitting boards, wherein the fixing bracket comprises a plurality of fixing portions arranged oppositely and a connecting portion vertically connected to the plurality of fixing portions; and a plurality of limiting portions are oppositely arranged on the plurality of fixing portions respectively, the plurality of limiting portions are arranged parallel to the connecting portions sequentially at intervals, and the limiting portions oppositely arranged are configured to limit and install one of the plurality of the laser emitting boards.

2. The laser emitting module according to claim 1, wherein when any one of the plurality of energy releasing circuits comprises a plurality of lasers and an energy releasing switch, the plurality of lasers and the energy releasing switch are connected in series, or the plurality of lasers and an output end of the energy releasing switch are connected in parallel.

3. The laser emitting module according to claim 1, wherein the charging energy storage circuit comprises an inductor, a first electronic switch transistor, a diode, and a capacitor;

a first end of the inductor forms a power supply input end of the charging energy storage circuit, a second end of the inductor, an anode of the diode, and a drain electrode of the first electronic switch transistor are connected together, a gate electrode of the first electronic switch transistor forms a controlled end of the charging energy storage circuit, a source electrode of the first electronic switch transistor is grounded, a cathode of the diode and a first end of the capacitor are connected to form a power supply output end of the charging energy storage circuit, and a second end of the capacitor is grounded;

each of the energy releasing switches comprises a second electronic switch transistor; and a drain electrode, a gate electrode, and a source electrode of the second electronic switch transistor form a power supply input end, a controlled end, and a power supply output end of the energy releasing switch respectively.

4. The laser emitting module according to claim 1, wherein, for each of the at least one laser emitting board, at least two groups of laser emitting circuits are correspondingly arranged on at least one of the first side surface and the second side surface.

5. The laser emitting module according to claim 1, wherein there are four fixing portions, and the four fixing portions are vertically, fixedly installed at four diagonal corners of the connecting portion; and the limiting portions of the four fixing portions are positioned and installed at diagonal conner positions of the corresponding laser emitting board.

6. A LiDAR apparatus, comprising a laser receiving module, a main control module, and the laser emitting module according to claim 1, wherein the main control module is connected to the laser receiving module and the laser emitting module respectively and is configured to output a drive control signal to drive the laser emitting module to emit laser pulses according to a preset timing sequence;

the laser receiving module and the laser emitting module are correspondingly provided;

the laser receiving module is configured to receive a plurality of reflected laser pulses and convert the reflected laser pulses into a plurality of corresponding echo signals; and the main control module is configured to determine distance information of an object to be measured according to the plurality of corresponding echo signals.

7. The LiDAR apparatus according to claim 6, wherein the laser receiving module comprises a receiving board; and a plurality of photoelectric converters corresponding to the plurality of lasers are arranged on the receiving board in an array.

\* \* \* \* \*